United States Patent
Hisano et al.

(10) Patent No.: US 11,378,388 B2
(45) Date of Patent: Jul. 5, 2022

(54) SUBSTRATE INSPECTION METHOD, SUBSTRATE INSPECTION APPARATUS AND RECORDING MEDIUM

(71) Applicant: Tokyo Electron Limited, Tokyo (JP)

(72) Inventors: Kazuya Hisano, Koshi (JP); Akiko Kiyotomi, Koshi (JP); Yasuaki Noda, Koshi (JP); Keisuke Hamamoto, Koshi (JP); Tadashi Nishiyama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 39 days.

(21) Appl. No.: 16/578,591

(22) Filed: Sep. 23, 2019

(65) Prior Publication Data
US 2020/0096321 A1 Mar. 26, 2020

(30) Foreign Application Priority Data
Sep. 26, 2018 (JP) .............................. JP2018-180653

(51) Int. Cl.
*G01B 11/16* (2006.01)
*H01L 21/687* (2006.01)
(Continued)

(52) U.S. Cl.
CPC .............. *G01B 11/16* (2013.01); *G06T 7/001* (2013.01); *G06T 7/50* (2017.01); *G06T 7/70* (2017.01);
(Continued)

(58) Field of Classification Search
CPC ................ G01B 11/16; G01B 2210/56; G06T 2207/30148; G06T 7/001; G06T 3/60;
(Continued)

(56) References Cited

U.S. PATENT DOCUMENTS

2008/0013089 A1* 1/2008 Ishii ...................... G03F 9/7011
356/400
2009/0269863 A1* 10/2009 Tomita .............. H01L 21/28518
438/7
(Continued)

FOREIGN PATENT DOCUMENTS

JP         H11-333355 A    12/1999
JP         2002-158166 A    5/2002

*Primary Examiner* — Christopher S Kelley
*Assistant Examiner* — Ana Picon-Feliciano
(74) *Attorney, Agent, or Firm* — Pearne & Gordon LLP

(57) ABSTRACT

A substrate inspection method includes a first process of taking, while rotating a holding table where a reference substrate is held, an image of an end surface of the reference substrate; a second process of obtaining shape data on the end surface of the reference substrate by processing the image; a third process of taking, while rotating the holding table where a target substrate is held, an image of an end surface of the target substrate; a fourth process of obtaining shape data on the end surface of the target substrate by processing the image; and a fifth process of calculating a warpage amount of the target substrate by obtaining a difference between the shape data obtained in the second process and in the fourth process under a condition that a rotational position of the holding table in the first process coincides with that in the third process.

8 Claims, 26 Drawing Sheets

(51) Int. Cl.
*H01L 21/66* (2006.01)
*H01L 21/67* (2006.01)
*G06T 7/70* (2017.01)
*G06T 7/00* (2017.01)
*G06T 7/50* (2017.01)

(52) U.S. Cl.
CPC .. *H01L 21/67288* (2013.01); *H01L 21/68764* (2013.01); *H01L 22/12* (2013.01); *G01B 2210/56* (2013.01); *G06T 2207/30148* (2013.01)

(58) Field of Classification Search
CPC . G06T 2207/30108; G06T 2207/30164; G06T 2207/30136; G06T 2207/30168; G06T 7/0002; G06T 7/0004; G06T 7/50; G06T 7/70; H01L 21/67173; H01L 21/67178; H01L 21/67184; H01L 21/67288; H01L 21/68764; H01L 22/12

USPC .......................................................... 348/92
See application file for complete search history.

(56) References Cited

U.S. PATENT DOCUMENTS

| | | | |
|---|---|---|---|
| 2010/0143832 A1* | 6/2010 | Houben | G03F 7/707 430/30 |
| 2012/0308215 A1* | 12/2012 | Li | F27D 19/00 392/416 |
| 2014/0315330 A1* | 10/2014 | Fujimori | G03F 7/7085 438/7 |
| 2016/0209763 A1* | 7/2016 | Saito | G03F 7/2028 |
| 2017/0243738 A1* | 8/2017 | Noda | G03F 7/168 |
| 2017/0244936 A1* | 8/2017 | Koga | G01N 21/8806 |
| 2020/0098605 A1* | 3/2020 | Tsai | G01N 21/9501 |

* cited by examiner

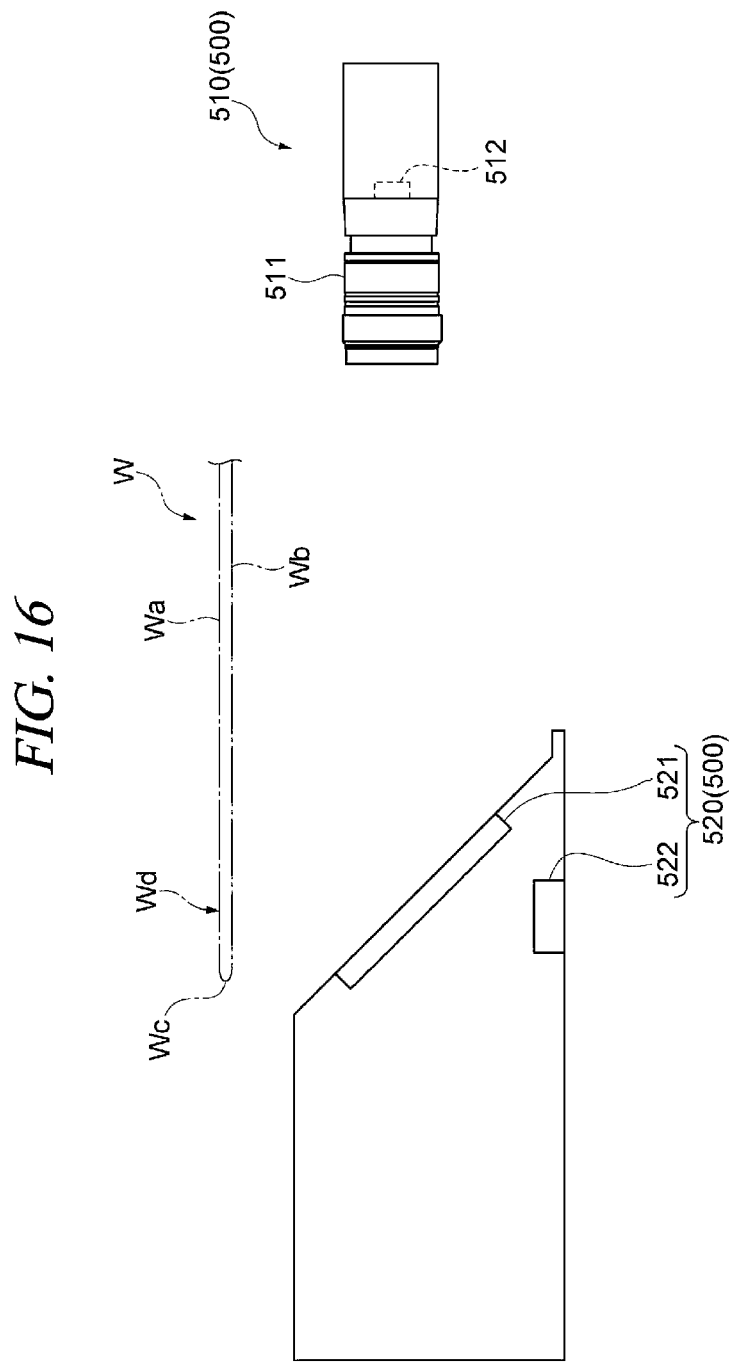

SUBSTRATE INSPECTION METHOD, SUBSTRATE INSPECTION APPARATUS AND RECORDING MEDIUM

CROSS-REFERENCE TO RELATED APPLICATION

This application claims the benefit of Japanese Patent Application No. 2018-180653 filed on Sep. 26, 2018, the entire disclosures of which are incorporated herein by reference.

TECHNICAL FIELD

The embodiments described herein pertain generally to a substrate inspection method, a substrate inspection apparatus, and a recording medium.

BACKGROUND

If a resist film is formed by spin coating during microprocessing of a substrate (e.g., a semiconductor wafer), it is formed on the entire surface of the wafer. However, to transfer the wafer by a transfer arm, when the transfer arm holds the periphery of the wafer, the resist film may be attached to the transfer arm. For this reason, a periphery removing process for removing the resist film present on the periphery of the wafer may be performed in some cases (see, e.g., Patent Documents 1 and 2).

Patent Document 1: Japanese Patent Laid-open Publication No. H11-333355
Patent Document 2: Japanese Patent Laid-open Publication No. 2002-158166

SUMMARY

In an exemplary embodiment, a substrate inspection method includes taking, while rotating a holding table on which a reference substrate whose warpage amount is already known is held, an image of an end surface of the reference substrate over an entire circumference of a periphery of the reference substrate by a camera; obtaining shape data on the end surface of the reference substrate over the entire circumference of the periphery of the reference substrate by processing the image obtained in the taking of the image of the end surface of the reference substrate; taking, while rotating the holding table on which a target substrate is held, an image of an end surface of the target substrate over an entire circumference of a periphery of the target substrate by the camera; obtaining shape data on the end surface of the target substrate over the entire circumference of the periphery of the target substrate by processing the image obtained in the taking of the image of the end surface of the target substrate; and calculating a warpage amount of the target substrate by obtaining a difference between the shape data obtained in the obtaining of the shape data on the end surface of the reference substrate and the shape data obtained in the obtaining of the shape data on the end surface of the target substrate under a condition that a rotational position of the holding table in the taking of the image of the end surface of the reference substrate coincides with a rotational position of the holding table in the taking of the image of the end surface of the target substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 16 is a side view of a rear surface imaging sub-unit in the substrate processing system according to the exemplary embodiment;

DETAILED DESCRIPTION

Figure 1:
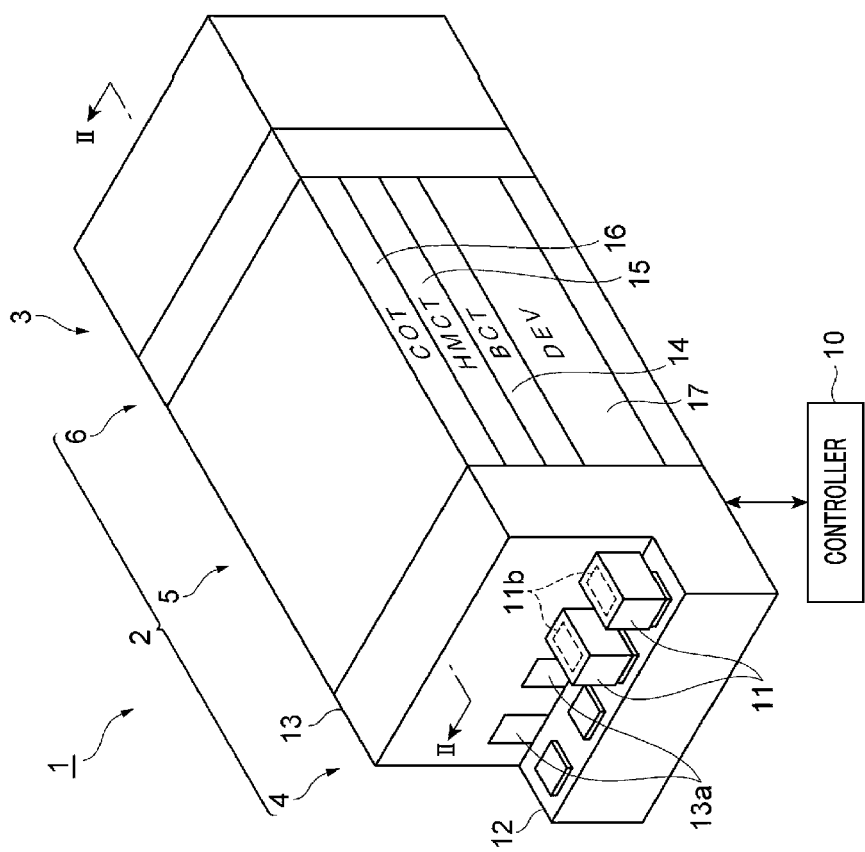
FIG. 1 is a perspective view illustrating a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current embodiment. Still, the embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following embodiments are examples for describing the present disclosure, and the present disclosure is not limited thereto. In the following description, same parts or parts having same function will be assigned same reference numerals, and redundant description will be omitted.

In one exemplary embodiment, there is provided a substrate inspection method. The substrate inspection method includes taking, while rotating a holding table on which a reference substrate whose warpage amount is already known is held, an image of an end surface of the reference substrate over an entire circumference of a periphery of the reference substrate by a camera; obtaining shape data on the end surface of the reference substrate over the entire circumference of the periphery of the reference substrate by processing the image obtained in the taking of the image of the end surface of the reference substrate; taking, while rotating the holding table on which a target substrate is held, an image of an end surface of the target substrate over an entire circumference of a periphery of the target substrate by the camera; obtaining shape data on the end surface of the target substrate over the entire circumference of the periphery of the target substrate by processing the image obtained in the taking of the image of the end surface of the target substrate; and calculating a warpage amount of the target substrate by obtaining a difference between the shape data obtained in the obtaining of the shape data on the end surface of the reference substrate and the shape data obtained in the obtaining of the shape data on the end surface of the target substrate under a condition that a rotational position of the holding table in the taking of the image of the end surface of the reference substrate coincides with a rotational position of the holding table in the taking of the image of the end surface of the target substrate.

According to the above-described substrate inspection method, when the warpage amount of the target substrate is calculated, under the condition that the rotational position of the holding table in the taking of the image of the end surface of the reference substrate coincides with the rotational position of the holding table in the taking of the image of the end surface of the target substrate, the difference between the shape data obtained in the obtaining of the shape data on the end surface of the reference substrate and the shape data obtained in the obtaining of the shape data on the end surface of the target substrate is obtained. In this configuration, it is possible to suppress a component corresponding to a change in shape depending on the rotational position of the holding table from being included in the warpage amount. Therefore, it is possible to calculate the warpage amount with higher precision.

The holding table has a reference point serving as a reference of rotation of the holding table. In the taking of the image of the end surface of the reference substrate, information specifying a position of the reference point when the holding table is rotated is obtained. In the taking of the image of the end surface of the target substrate, information specifying a position of the reference point when the holding table is rotated is obtained. In the calculating of the warpage amount of the target substrate, the information specifying the position of the reference point when the holding table is rotated in the taking of the image of the end surface of the reference substrate is related to the shape data obtained in the obtaining of the shape data on the end surface of the reference substrate; the information specifying the position of the reference point when the holding table is rotated in the taking of the image of the end surface of the target substrate is related to the shape data obtained in the obtaining of the shape data on the end surface of the target substrate; and the difference between the shape data obtained in the obtaining of the shape data on the end surface of the reference substrate and the shape data obtained in the obtaining of the shape data on the end surface of the target substrate is obtained under a condition that the position of the reference point of the holding table in the taking of the image of the end surface of the reference substrate coincides with the position of the reference point of the holding table in the taking of the image of the end surface of the target substrate.

In the above-described aspects, the reference point serving as the reference of the rotation of the holding table is previously determined and the position of the reference point when the holding table is rotated is specified, and then, under the condition that the position of the reference point of the holding table in the taking of the image of the end surface of the reference substrate coincides with the position of the reference point of the holding table in the taking of the image of the end surface of the target substrate, the difference between the shape data is obtained. In this configuration, the positions of the reference point can be used to rapidly find out conditions where the rotational position of the holding table in the taking of the image of the end surface of the reference substrate and the rotational position of the holding table in the taking of the image of the end surface of the target substrate coincide with each other, and, thus, the difference between the shape data can be obtained. Therefore, the warpage amount can be readily calculated with higher precision.

A rotational position of the holding table obtained immediately before the reference substrate is held in the taking of the image of the end surface of the reference substrate is allowed to coincide with a rotational position of the holding table obtained immediately before the target substrate is held in the taking of the image of the end surface of the target substrate, and in the calculating of the warpage amount of the target substrate, the difference between the shape data obtained in the obtaining of the shape data on the end surface of the reference substrate and the shape data obtained in the obtaining of the shape data on the end surface of the target substrate is obtained.

In the above-described aspects, the rotational position of the holding table obtained immediately before the reference substrate is held is allowed to coincide with the rotational position of the holding table obtained immediately before the target substrate is held. For this reason, when the difference between the shape data is obtained in the calculating of the warpage amount of the target substrate, the conditions where the rotational position of the holding table in the taking of the image of the end surface of the reference substrate and the rotational position of the holding table in the taking of the image of the end surface of the target substrate coincide with each other can be created even without performing a correction or the like. Therefore, the warpage amount can be readily calculated with higher precision.

The reference substrate is flat. The shape data obtained in the obtaining of the shape data on the end surface of the reference substrate are data on a first profile line passing through a center of the end surface of the reference substrate. The shape data obtained in the obtaining of the shape data on the end surface of the target substrate are data on a second profile line passing through a center of the end surface of the target substrate. In this case, the warpage amount of the target substrate can be more readily calculated from the data on the first profile line and the second profile line.

In another exemplary embodiment, there is provided a substrate inspection apparatus. The substrate inspection apparatus includes a holding table configured to hold and rotate a target substrate; and a controller configured to control a camera. The controller performs: taking, while rotating the holding table on which a reference substrate whose warpage amount is already known is held, an image of an end surface of the reference substrate over an entire circumference of a periphery of the reference substrate by the camera; obtaining shape data on the end surface of the reference substrate over the entire circumference of the periphery of the reference substrate by processing the image obtained in the taking of the image of the end surface of the reference substrate; taking, while rotating the holding table on which the target substrate is held, an image of an end surface of the target substrate over an entire circumference of a periphery of the target substrate by the camera; obtaining shape data on the end surface of the target substrate over the entire circumference of the periphery of the target substrate by processing the image obtained in the taking of the image of the end surface of the target substrate; and calculating a warpage amount of the target substrate by obtaining a difference between the shape data obtained in the obtaining of the shape data on the end surface of the reference substrate and the shape data obtained in the obtaining of the shape data on the end surface of the target substrate under a condition that a rotational position of the holding table in the taking of the image of the end surface of the reference substrate coincides with a rotational position of the holding table in the taking of the image of the end surface of the target substrate.

According to the above-described substrate inspection apparatus, when the controller calculates the warpage amount of the target substrate, under the condition that the rotational position of the holding table in the taking of the image of the end surface of the reference substrate coincides with the rotational position of the holding table in the taking of the image of the end surface of the target substrate, the difference between the shape data obtained in the obtaining of the shape data on the end surface of the reference substrate and the shape data obtained in the obtaining of the shape data on the end surface of the target substrate is obtained. In this configuration, it is possible to suppress the component corresponding to the change in the shape depending on the rotational position of the holding table from being included in the warpage amount. Therefore, it is possible to calculate the warpage amount with higher precision.

In another exemplary embodiment, there is provided a computer-readable recording medium having stored thereon computer-executable instructions that, in response to execution, cause a substrate inspection apparatus to perform a substrate inspection method as described above.

In this case, the same operation and effect as the above-described substrate processing method can be obtained. In the present specification, the computer-readable recoding medium includes a non-transitory tangible medium (non-transitory computer recording medium) (e.g., various main storage devices or auxiliary storage devices) and a radio signal (transitory computer recording medium) (e.g., data signal that can be supplied through a network).

Hereinafter, various embodiments will be described in detail with reference to the accompanying drawings. Further, in the drawings, similar symbols typically identify similar components, unless context dictates otherwise.

[Substrate Processing System]

As illustrated in FIG. 1, a substrate processing system 1 (substrate inspection apparatus) includes a coating and developing apparatus 2 and a controller 10. The substrate processing system 1 is also equipped with an exposure apparatus 3. The exposure apparatus 3 includes a controller (not shown) capable of communicating with the controller 10 of the substrate processing system 1. The exposure apparatus 3 receives a wafer W (substrate) from the coating and developing apparatus 2 and performs an exposure processing (pattern exposure) on a photosensitive resist film formed on a front surface Wa (see FIG. 5) of the wafer W. Specifically, an exposure target portion of the photosensitive resist film (photosensitive film) is selectively irradiated with energy rays by a method such as immersion exposure. Examples of the energy rays may include an ArF excimer laser, a KrF excimer laser, a g-line, an i-line or an extreme ultraviolet (EUV).

The coating and developing apparatus 2 performs a process of forming a photosensitive resist film or a non-photosensitive resist film (hereinafter, also referred to as "resist film R" (see FIG. 5)) on the front surface Wa of the wafer W before the exposure processing by the exposure apparatus 3. Further, after the exposure processing on the photosensitive resist film by the exposure apparatus 3, the coating and developing apparatus 2 performs a development process of the photosensitive resist film.

The wafer W may have a circular plate shape or may have a plate shape, such as a polygonal shape, other than the circular shape. The wafer W may have a cutout formed by partially cutting out the wafer W. The cutout may be, e.g., a notch (U-shape or V-shaped groove) or a linearly extending part (so-called orientation flat). The wafer W may be, e.g., a semiconductor substrate, a glass substrate, a mask substrate, an FPD (Flat Panel Display) substrate, or other various substrates. A diameter of the wafer W may be, e.g., about 200 mm to 450 mm. When an edge of the wafer W is beveled (chamfered), the "front surface" in this specification includes the bevel portion when seen from the front surface Wa of the wafer W. Similarly, a "rear surface" in this specification includes the bevel portion when seen from a rear surface Wb of the wafer W (see FIG. 5). A "end surface" in this specification includes the bevel portion when seen from an end surface We of the wafer W (see FIG. 5).

As illustrated in FIG. 1 to FIG. 4, the coating and developing apparatus 2 includes a carrier block 4, a processing block 5, and an interface block 6. The carrier block 4, the processing block 5, and the interface block 6 are arranged in the horizontal direction.

Figure 3:
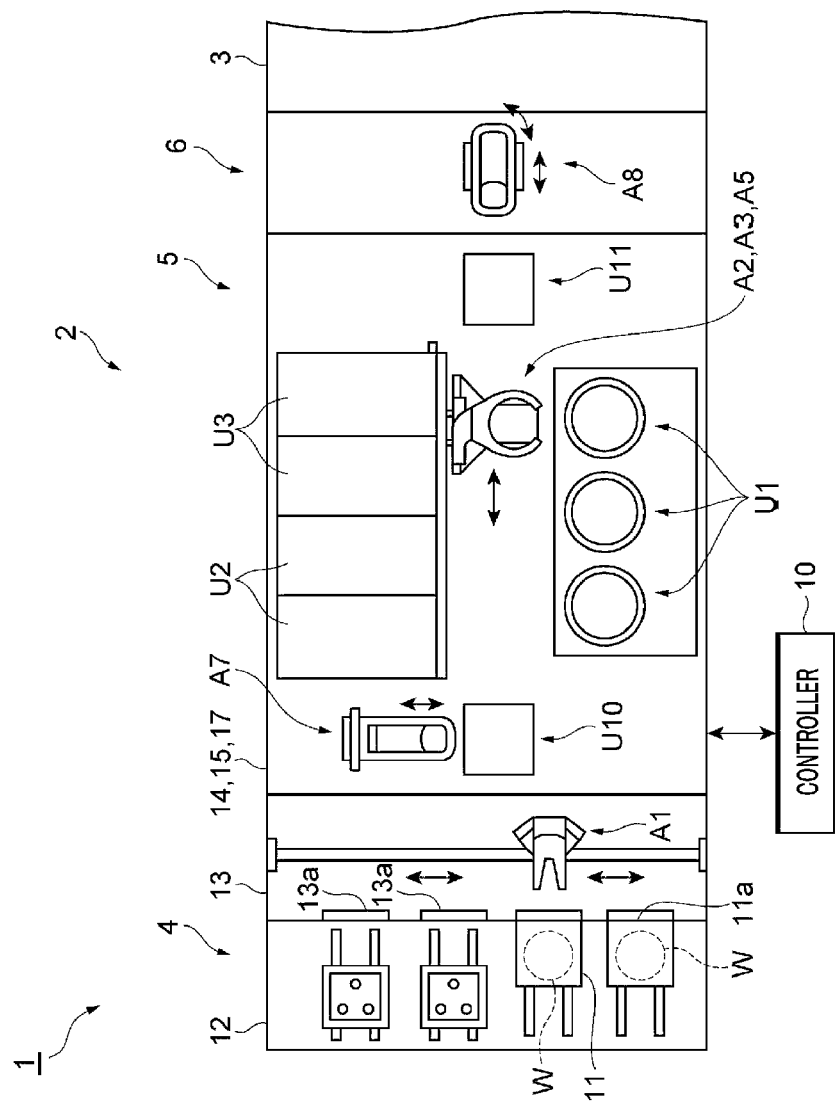
FIG. 3 is a top view illustrating unit processing blocks (BCT block, HMCT block, and DEV block) in the substrate processing system according to the exemplary embodiment.
Figure 4:
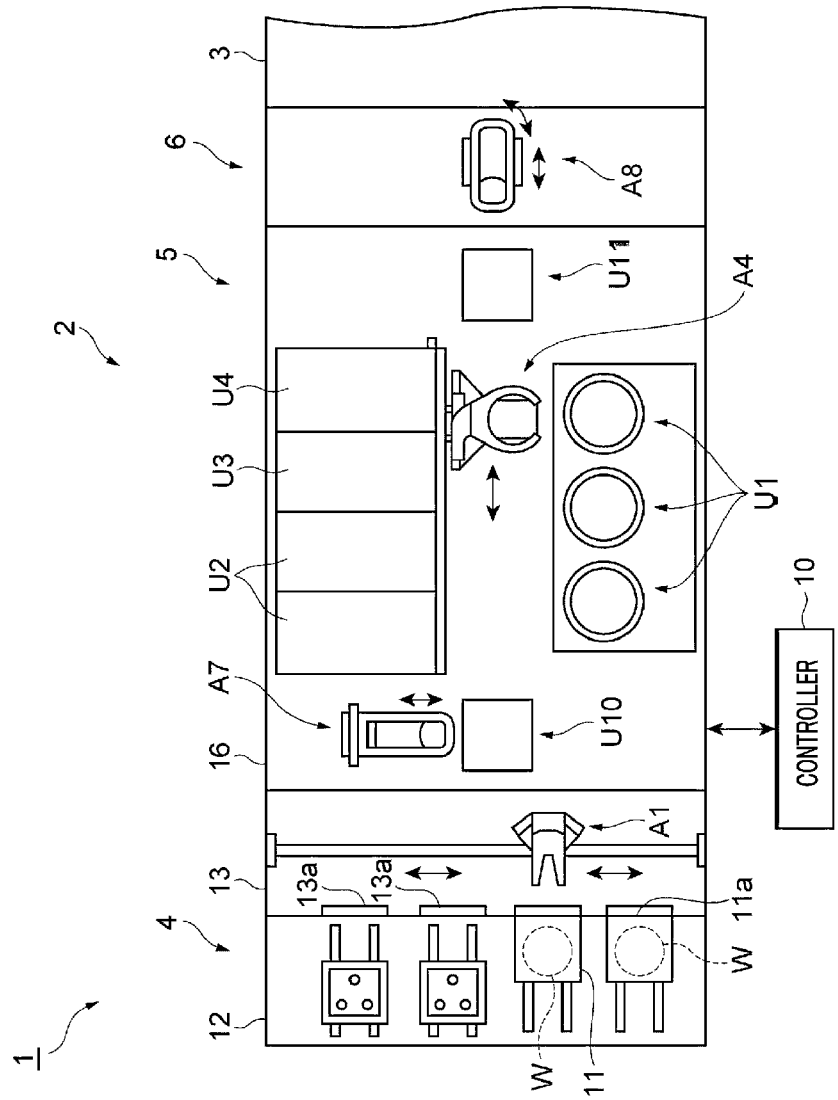
FIG. 4 is a top view illustrating a unit processing block (COT block) in the substrate processing system according to the exemplary embodiment.

As illustrated in FIG. 1, FIG. 3 and FIG. 4, the carrier block 4 includes a carrier station 12 and a carry-in/out section 13. The carrier station 12 supports a plurality of carriers 11. Each of the carriers 11 accommodates at least one wafer W in a sealed state. An opening/closing door (not illustrated) through which the wafer W is carried-in/out is provided on a side surface 11a of the carrier 11. The carrier 11 is detachably provided on the carrier station 12 such that the side surface 11a faces the carry-in/out section 13's side.

A recording medium 11b is disposed in the carrier 11 (see FIG. 1). The recording medium 11b is, e.g., a non-volatile memory, and stores information on respective wafers W in the carrier 11 (which will be described later in detail). When the carrier 11 is mounted on the carrier station 12, the controller 10 can access the recording medium 11b, so that the information stored in the recording medium 11b can be read out, and that information can be written in the recording medium 11b.

The carry-in/out section 13 is located between the carrier station 12 and the processing block 5. The carry-in/out section 13 includes a plurality of opening/closing doors 13a. When the carrier 11 is placed on the carrier station 12, the opening/closing door of the carrier 11 faces the opening/closing door 13a. By opening the opening/closing door 13a and the opening/closing door of the side surface 11a at the same time, the inside of the carrier 11 communicates with the inside of the carry-in/out section 13. The carry-in/out section 13 incorporates a delivery arm A1. The deliver arm A1 takes the wafer W out from the carrier 11 and delivers it to the processing block 5, as well as receives the wafer W from the processing block 5 and returns it into the carrier 11.

Figure 2:
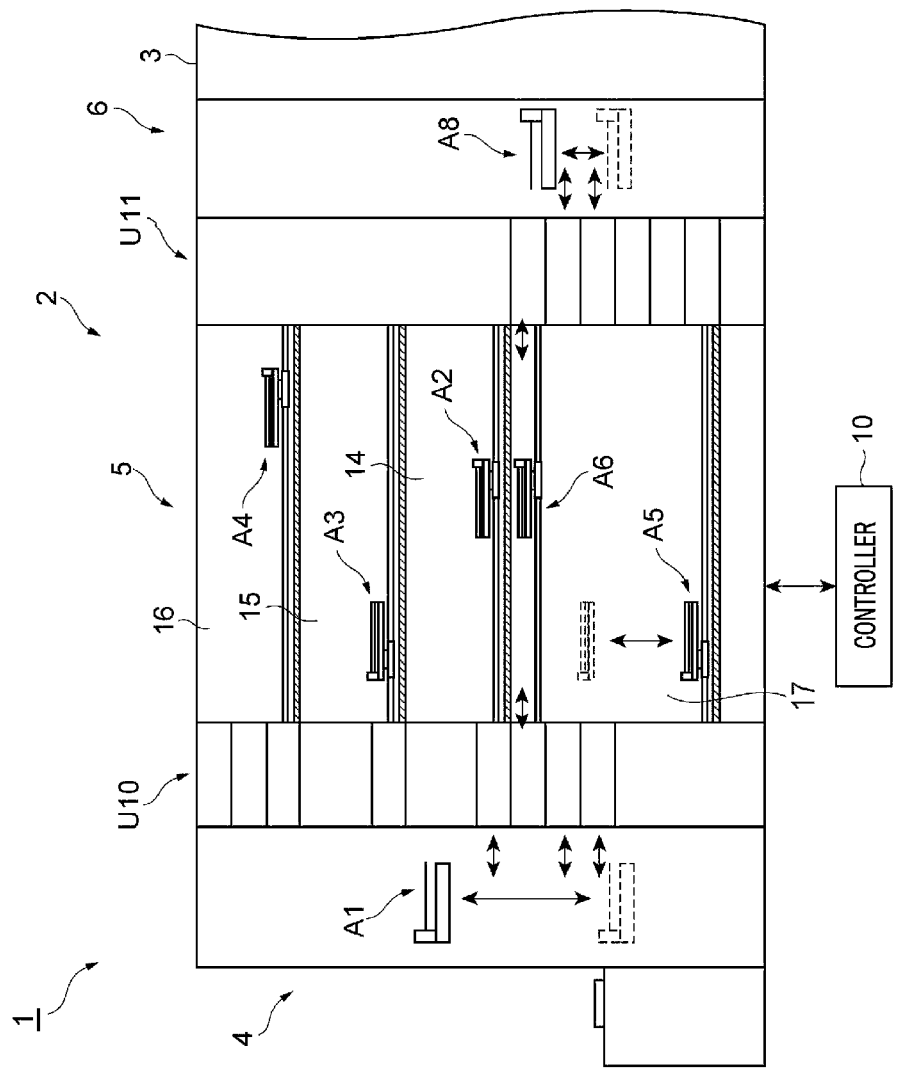
FIG. 2 is a cross-sectional view as taken along a line II-II of FIG. 1.

As illustrated in FIG. 1 and FIG. 2, the processing block 5 includes unit processing blocks 14 to 17. The unit processing blocks 14 to 17 are arranged such that the unit processing block 17, the unit processing block 14, the unit processing block 15, and the unit processing block 16 are arranged in this order from the bottom. As shown in FIG. 3, each of the unit processing blocks 14, 15 and 17 has a liquid processing unit U1, a heat treatment unit U2 (heater), and an inspection unit U3. As shown in FIG. 4, the unit processing block 16 has the liquid processing unit U1, the heat treatment unit U2 (heater), the inspection unit U3, and a periphery exposure unit U4.

The liquid processing unit U1 is configured to supply various types of processing liquids to the front surface Wa of the wafer W (which will be described later in detail). The heat treatment unit U2 is configured to perform a heat treatment by heating the wafer W with, e.g., a heating plate and by cooling the heated wafer W with, e.g., a cooling plate. The inspection unit U3 is configured to inspect respective surfaces (front surface Wa, rear surface Wb, and end surface We (see FIG. 5)) of the wafer W (which will be described later in detail). The periphery exposure unit U4 is configured to irradiate a peripheral portion Wd (see FIG. 5) of the wafer W on which the resist film R is formed with ultraviolet ray so as to expose the resist film R on the peripheral portion Wd.

The unit processing block 14 is a bottom film forming block (BCT block) configured to form a bottom film on the front surface Wa of the wafer W. The unit processing block 14 includes a transfer arm A2 configured to transfer the wafers W to the respective units U1 to U3 (see FIG. 2 and FIG. 3). The liquid processing unit U1 of the unit processing block 14 forms a coating film by coating the front surface Wa of the wafer W with a coating liquid for forming the bottom film. The heat treatment unit U2 of the unit processing block 14 performs various heat treatments for forming the bottom film. A specific example of the heat treatments may be a heat treatment for hardening the coating film into the bottom film. The bottom film may be, e.g., an antireflection (SiARC) film.

The unit processing block 15 is an intermediate film (hard mask) forming block (HMCT block) configured to form an intermediate film on the bottom film. The unit processing block 15 includes a transfer arm A3 configured to transfer the wafers W to the respective units U1 to U3 (see FIG. 2 and FIG. 3). The liquid processing unit U1 of the unit processing block 15 forms a coating film by coating the bottom film with a coating liquid for forming the intermediate film. The heat treatment unit U2 of the unit processing block 15 performs various heat treatments for forming the intermediate film. A specific example of the heat treatments may be a heat treatment for hardening the coating film into the intermediate film. The intermediate film may be, e.g., an SOC (Spin On Carbon) film or an amorphous carbon film.

The unit processing block 16 is a resist film forming block (COT block) configured to form a thermosetting resist film R on the intermediate film. The unit processing block 16 includes a transfer arm A4 configured to transfer the wafers W to the respective units U1 to U4 (see FIG. 2 and FIG. 4). The liquid processing unit U1 of the unit processing block 16 forms a coating film by coating the intermediate film with a coating liquid (resist agent) for forming a resist film. The heat treatment unit U2 of the unit processing block 16 performs various heat treatments for forming the resist film. A specific example of the heat treatments may be a heat treatment (PAB: Pre Applied Bake) for hardening the coating film into the resist film R.

The unit processing block 17 is a developing block (DEV block) configured to develop the exposed resist film R. The unit processing block 17 includes a transfer arm A5 configured to transfer the wafers W to the respective units U1 to U3, and a direct transfer arm A6 that transfers wafers W without passing through these units (see FIG. 2 and FIG. 3). The liquid processing unit U1 of the unit processing block 17 develops the exposed resist film R by supplying a developer to the exposed resist film R. The liquid processing unit U1 of the unit processing block 17 supplies a rinse liquid to the developed resist film R so as to rinse away the dissolved components of the resist film R together with the developer. Thus, the resist film R is partly removed, so that the resist pattern is formed. The heat treatment unit U2 of the unit processing block 17 performs various heat treatments for the developing processing. A specific example of the heat treatments may be a heat treatment before the developing processing (PEB: Post Exposure Bake), a heat treatment after the developing processing (PB: Post Bake), and the like.

As shown in FIG. 2 to FIG. 4, a shelf unit U10 is provided in the processing block 5 near the carrier block 4. The shelf unit U10 extends from the floor surface to the unit processing block 15, and is divided into a plurality of cells arranged in the vertical direction. An elevation arm A7 is provided near the shelf unit U10. The elevation arm A7 moves the wafer W up and down among the cells of the shelf unit U10.

A shelf unit U11 is provided in the processing block 5 near the interface block 6. The shelf unit U11 extends from the floor surface to an upper portion of the unit processing block 17, and is divided into a plurality of cells arranged in the vertical direction.

The interface block 6 includes a delivery arm A8, and is connected to the exposure apparatus 3. The delivery arm A8 is configured to take the wafer W from the shelf unit U11 and deliver it to the exposure apparatus 3, and is configured to receive the wafer W from the exposure apparatus 3 and return it to the shelf unit U11.

The controller 10 controls the substrate processing system 1 partially or entirely. Details of the controller 10 will be described later. The controller 10 can also output and input a signal to and from the controller of the exposure apparatus 3. Due to the cooperation between the controllers, the substrate processing system 1 and the exposure apparatus 3 are controlled.

Configuration of Liquid Processing Unit

Figure 5:
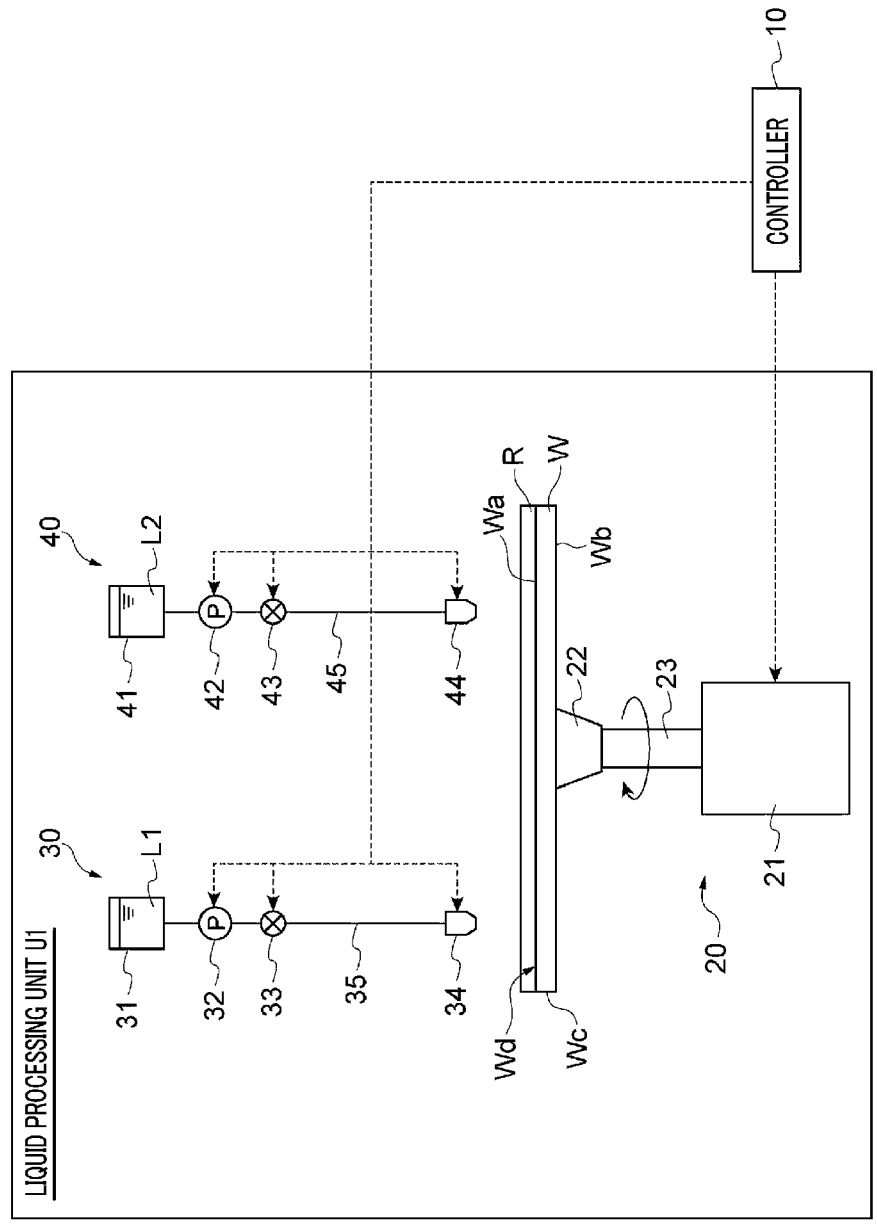
FIG. 5 is a schematic diagram illustrating a liquid processing unit in the substrate processing system according to the exemplary embodiment.

Hereinafter, the liquid processing unit U1 will be described in more detail with reference to FIG. 5. As shown in FIG. 5, the liquid processing unit U1 includes a rotary holder 20, a liquid supply 30 (coating liquid supply), and a liquid supply 40 (solvent supply).

The rotary holder 20 has a rotator 21 and a holder 22. The rotator 21 has a shaft 23 extending therefrom upwards. The rotator 21 rotates the shaft 23 by using, e.g., an electric motor as a power source. The holder 22 is provided on a leading end of the shaft 23. A wafer W is placed on the holder 22. The holder 22 is, e.g., a suction chuck configured to substantially horizontally hold the wafer W by, e.g., suction. The shape of the holder 22 (suction chuck) is not specifically limited, and may be, e.g., circular. The size of the holder 22 may be smaller than the wafer W. If the holder 22 has the circular shape, the holder 22 may have a size of, e.g., about 80 mm in diameter.

The rotary holder 20 rotates the wafer W about an axis (rotation axis) that is perpendicular to the front surface Wa of the wafer W, when the wafer W is substantially horizontally placed. In the present exemplary embodiment, since the rotation axis passes through the center of the circular wafer W, the rotation axis is also a center axis. In the present exemplary embodiment, as shown in FIG. 5, the rotary holder 20 rotates the wafer W clockwise when seen from above.

The liquid supply 30 is configured to supply a processing liquid L1 onto the front surface Wa of the wafer W. In the unit processing blocks 14 to 16, the processing liquid L1 is the coating liquid for forming the bottom film, the intermediate film, or the resist film. In this case, the liquid supply 30 functions as a coating liquid supply. In the unit processing block 17, the processing liquid L1 is the developer. In this case, the liquid supply 30 functions as a developer supply.

The liquid supply 30 includes a liquid source 31, a pump 32, a valve 33, a nozzle 34, and a pipe 35. The liquid source 31 functions as a source of the processing liquid L1. The pump 32 pumps the processing liquid L1 from the liquid source 31 into the nozzle 34 through the pipe 35 and the valve 33. The nozzle 34 is provided above the wafer W such that a discharge opening thereof is directed toward the front surface Wa of the wafer W. The nozzle 34 is configured to be movable in the horizontal direction and in the vertical direction by a non-illustrated drive unit. The nozzle 34 can discharge the processing liquid L1 sent from the pump 32 onto the front surface Wa of the wafer W. The pipe 35 is connected to the liquid source 31, the pump 32, the valve 33, and the nozzle 34 in this order from the upstream side.

The liquid supply 40 is configured to supply a processing liquid L2 onto the front surface Wa of the wafer W. In the unit processing blocks 14 to 16, the processing liquid L2 is the organic solvent for removing the bottom film, the intermediate film or the resist film from the wafer W. In this case, the liquid supply 40 functions as a solvent supply. In the unit processing block 17, the processing liquid L2 is the rinse liquid. In this case, the liquid supply 40 functions as a rinse liquid supply.

The liquid supply 40 includes a liquid source 41, a pump 42, a valve 43, a nozzle 44, and a pipe 45. The liquid source 41 functions as a source of the processing liquid L2. The pump 42 pumps the processing liquid L2 from the liquid source 41 into the nozzle 44 through the pipe 45 and the valve 43. The nozzle 44 is provided above the wafer W such that a discharge opening thereof is directed toward the front surface Wa of the wafer W. The nozzle 44 is configured to be movable in the horizontal direction and in the vertical direction by a non-illustrated drive unit. The nozzle 44 can discharge the processing liquid L2 sent from the pump 42 onto the front surface Wa of the wafer W. The pipe 45 is connected to the liquid source 41, the pump 42, the valve 43, and the nozzle 44 in this order from the upstream side.

Configuration of Inspection Unit

Figure 6:
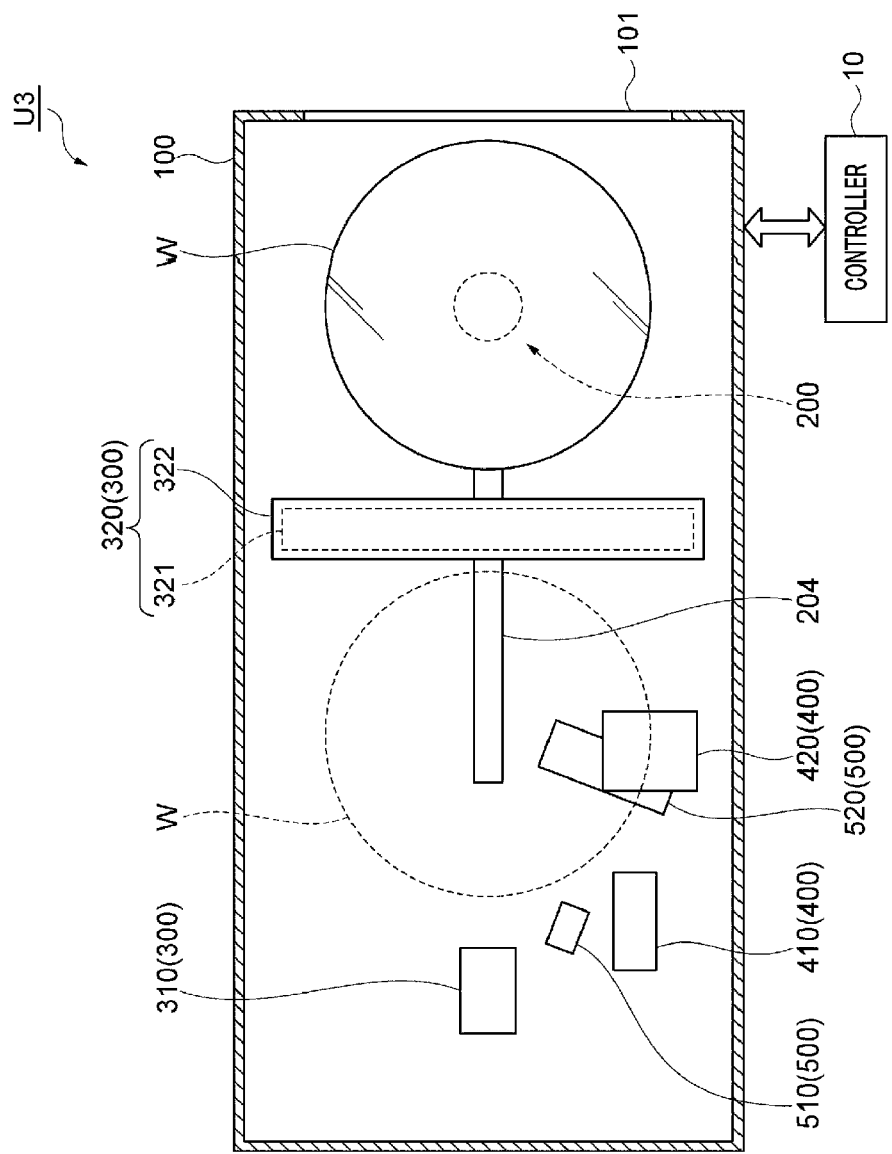
FIG. 6 is a top side cross-sectional view of an inspection unit in the substrate processing system according to the exemplary embodiment.
Figure 7:
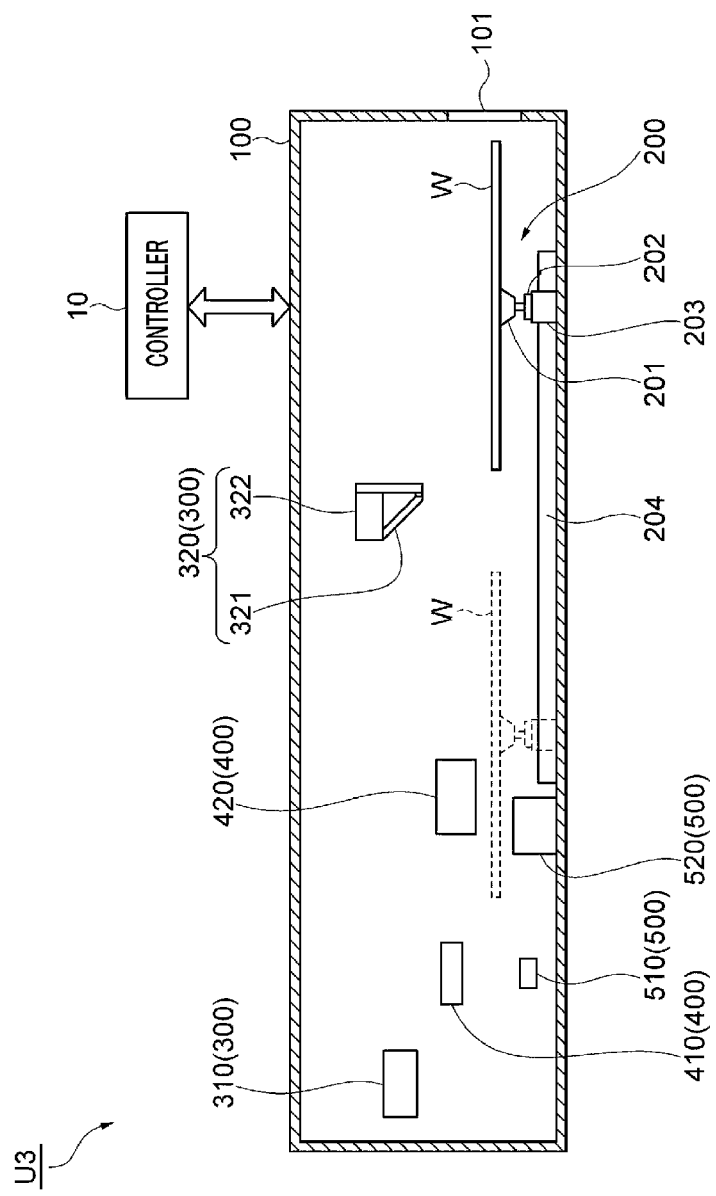
FIG. 7 is a side cross-sectional view of the inspection unit in the substrate processing system according to the exemplary embodiment.
Figure 8:
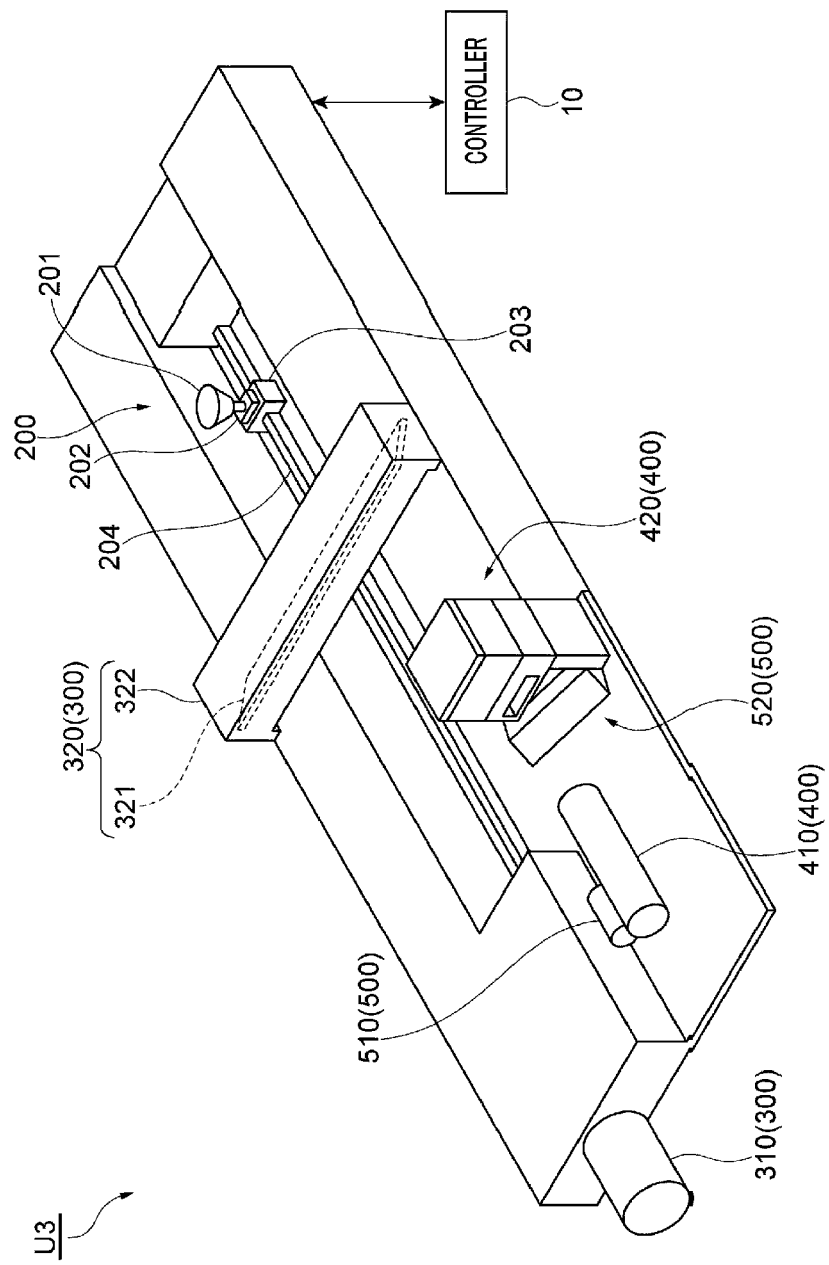
FIG. 8 is a perspective view illustrating the inspection unit in the substrate processing system according to the exemplary embodiment.

Hereinafter, the inspection unit U3 will be described in more detail with reference to FIG. 6 to FIG. 16. As shown in FIG. 6 to FIG. 8, the inspection unit U3 includes a housing 100, a rotary holder sub-unit 200 (rotary holder), a front surface imaging sub-unit 300, a periphery imaging sub-unit 400 (substrate imaging apparatus), and a rear surface imaging sub-unit 500. The respective sub-units 200 to 500 are accommodated in the housing 100. A carry-in/out opening 101 through which the wafer W is carried into the housing 100 and carried out of the housing 100 is formed at one end wall of the housing 100.

The rotary holder sub-unit 200 includes a holding table 201, actuators 202 and 203, and a guide rail 204. The holding table 201 is configured as a suction chuck configured to horizontally hold the wafer W by, e.g., suction. The shape of the holding table 201 (suction chuck) is not particularly limited, and may be, e.g., circular. The size of the holding table 201 may be smaller than the wafer W, or may be substantially the same as that of the holder 22

(suction chuck). If the holding table 201 has the circular shape, the holding table 201 (suction chuck) may have a size of, e.g., about 80 mm in diameter.

The actuator 202 is, e.g., an electric motor configured to rotate and drive the holding table 201. That is, the actuator 202 rotates the wafer W held on the holding table 201. The actuator 202 may include an encoder for detecting a rotational position of the holding table 201. In this case, imaging positions of the respective surfaces of the wafer W by the respective imaging sub-units 300, 400 and 500 and the rotational position can be related to each other. If the wafer W has the cutout, the posture of the wafer W can be specified based on the cutout recognized by the imaging sub-units 300, 400 and 500, and by the rotational position detected by the encoder. Herein, the rotational position of the holding table 201 refers to a rotational angle of the holding table 201.

The actuator 203 is, e.g., a linear actuator configured to move the holding table 201 along the guide rail 204. That is, the actuator 203 allows the wafer W held on the holding table 201 to be transferred between one end and the other end of the guide rail 204. Thus, the wafer W held on the holding table 201 can be moved between a first position near the carry-in/out opening 101 and a second position near the periphery imaging sub-unit 400 and the rear surface imaging sub-unit 500. The guide rail 204 extends linearly (e.g., like a straight line) in the housing 100.

The front surface imaging sub-unit 300 includes a camera 310 (imaging device) and an illuminating module 320. The camera 310 and the illuminating module 320 constitute a set of imaging modules. The camera 310 includes a lens and one imaging element (e.g., CCD image sensor, CMOS image sensor, etc.). The camera 310 is directed toward the illuminating module 320 (illuminator).

The illuminating module 320 includes a half mirror 321 and a light source 322. The half mirror 321 is provided in the housing 100 and inclined at about 45° with respect to the horizontal direction. The half mirror 321 is located above an intermediate portion of the guide rail 204 such that the half mirror 321 intersects the extension direction of the guide rail 204 when viewed from above. The half mirror 321 has a rectangular shape. The length (longitudinal length) of the half mirror 321 is larger than the diameter of the wafer W.

The light source 322 is located above the half mirror 321. As shown in FIG. 6, the light source 322 has a rectangular shape like the half mirror 321 but is greater in the longitudinal length than the half mirror 321. Light emitted from the light source 322 passes through the whole half mirror 321 so as to be irradiated downwards (toward the guide rail 204). The light having passed through the half mirror 321 is reflected by an object located below the half mirror 321, and is again reflected by the half mirror 321. Then, the light passes through the lens of the camera 310 and enters the imaging element of the camera 310. That is, the camera 310 can take an image of the object present in an irradiation area of the light source 322 through the half mirror 321. For example, when the holding table 201 holding the wafer W is moved by the actuator 203 along the guide rail 204, the camera 310 can take an image of the front surface Wa of the wafer W passing through the irradiation area of the light source 322. Data on the image taken by the camera 310 are sent to the controller 10.

As shown in FIG. 6 to FIG. 12, the periphery imaging sub-unit 400 includes a camera 410 (imaging device), an illuminating module 420, and a mirror member 430. The camera 410, the illuminating module 420 (illuminator), and the mirror member 430 constitute a set of imaging modules. The camera 410 includes a lens 411 and one imaging element 412 (e.g., CCD image sensor, CMOS image sensor, etc.). The camera 410 is directed toward the illuminating module 420.

As shown in FIG. 9 to FIG. 12, the illuminating module 420 is located above the wafer W held on the holding table 201. The illuminating module 420 includes a light source 421, a light scattering member 422, and a holding member 423. The light source 421 may be composed of, e.g., a plurality of LED point light sources 421*b* (see FIG. 12).

Figure 12:
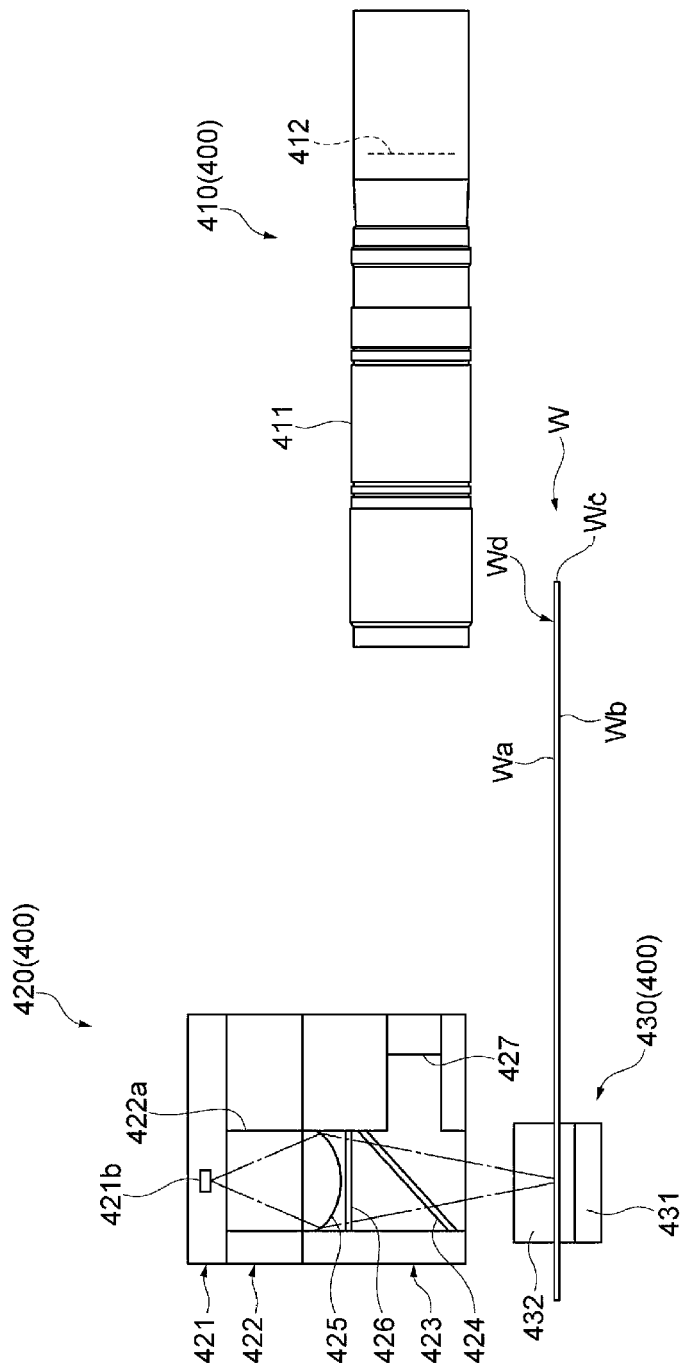
FIG. 12 is a side view of a rear surface imaging module in the substrate processing system according to the exemplary embodiment.
Figure 13:
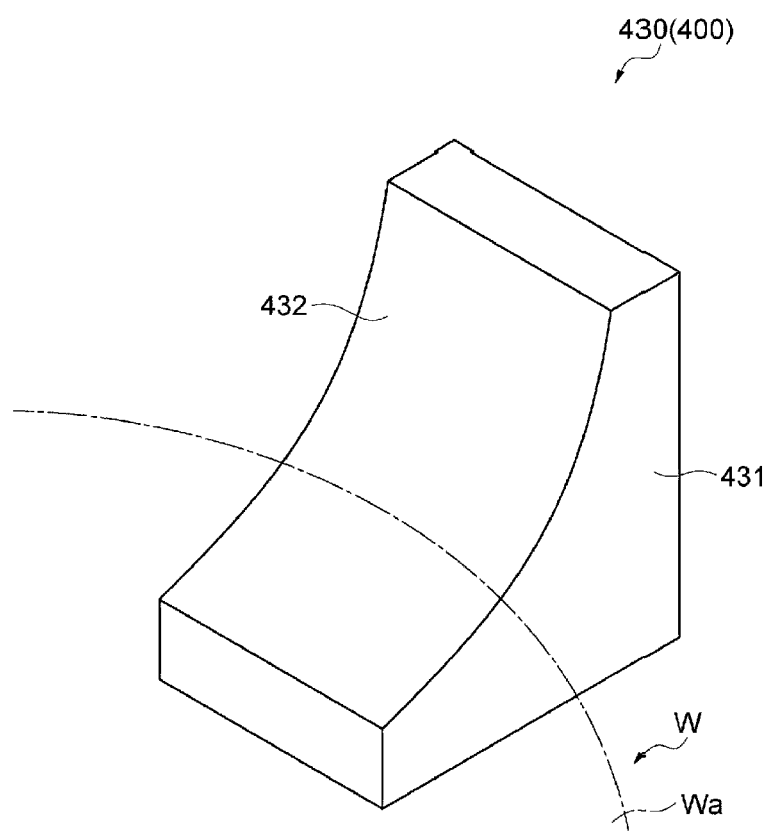
FIG. 13 is a perspective view illustrating a mirror member in the substrate processing system according to the exemplary embodiment.
Figure 14:
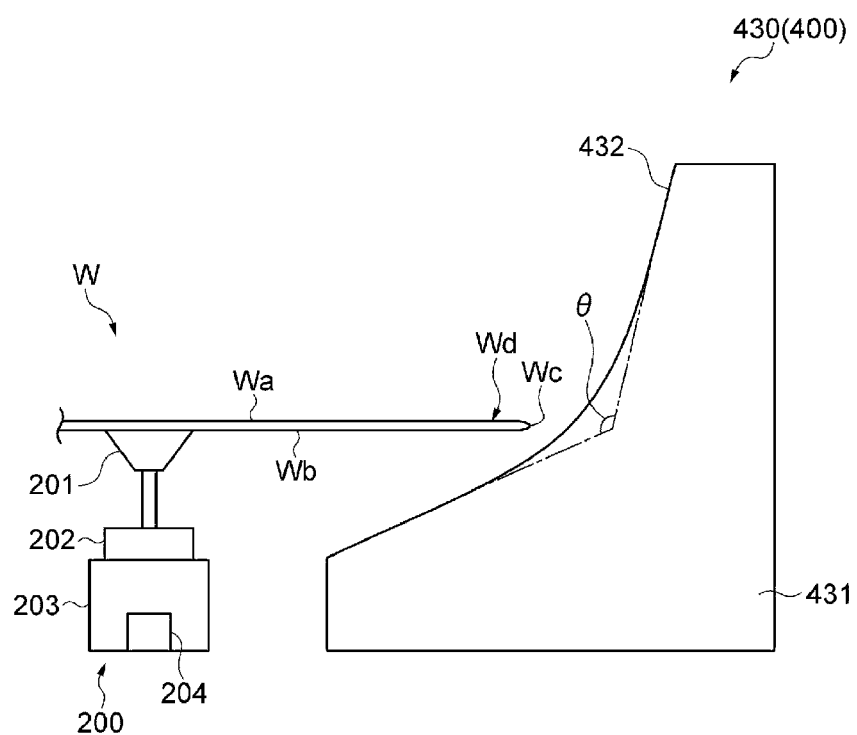
FIG. 14 is a side view illustrating the mirror member in the substrate processing system according to the exemplary embodiment.

As shown in FIG. 9 to FIG. 12, the holding member 423 holds therein a half mirror 424, a cylindrical lens 425, a light diffusing member 426, and a focus adjusting lens 427. As shown in FIG. 12 and FIG. 14, the half mirror 424 is provided on an intersection part between a through hole and an intersection hole, and inclined at about 45° with respect to the horizontal direction. The half mirror 424 has a rectangular shape.

Figure 9:
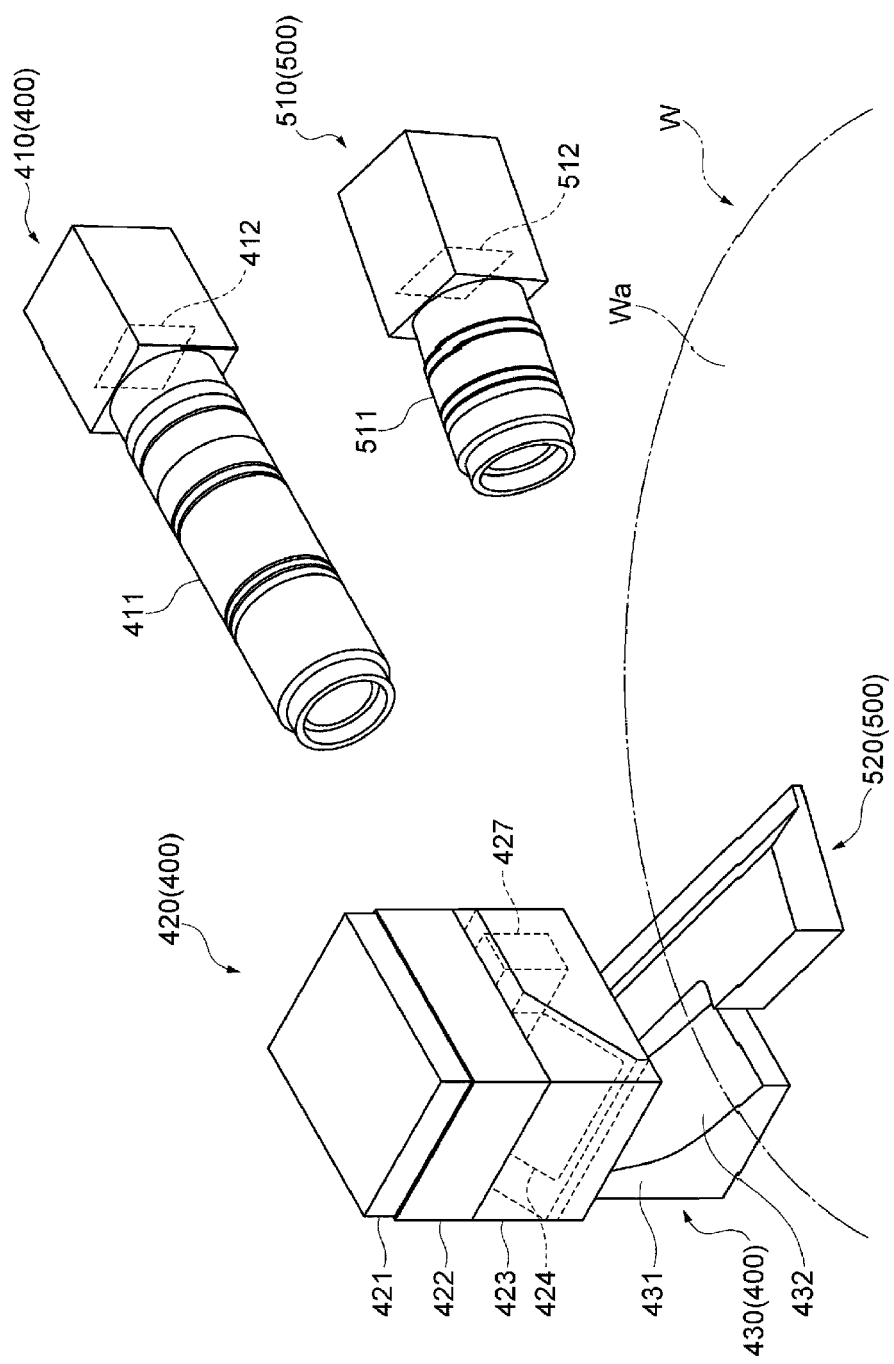
FIG. 9 is a front side perspective view of a periphery imaging sub-unit in the substrate processing system according to the exemplary embodiment.
Figure 10:
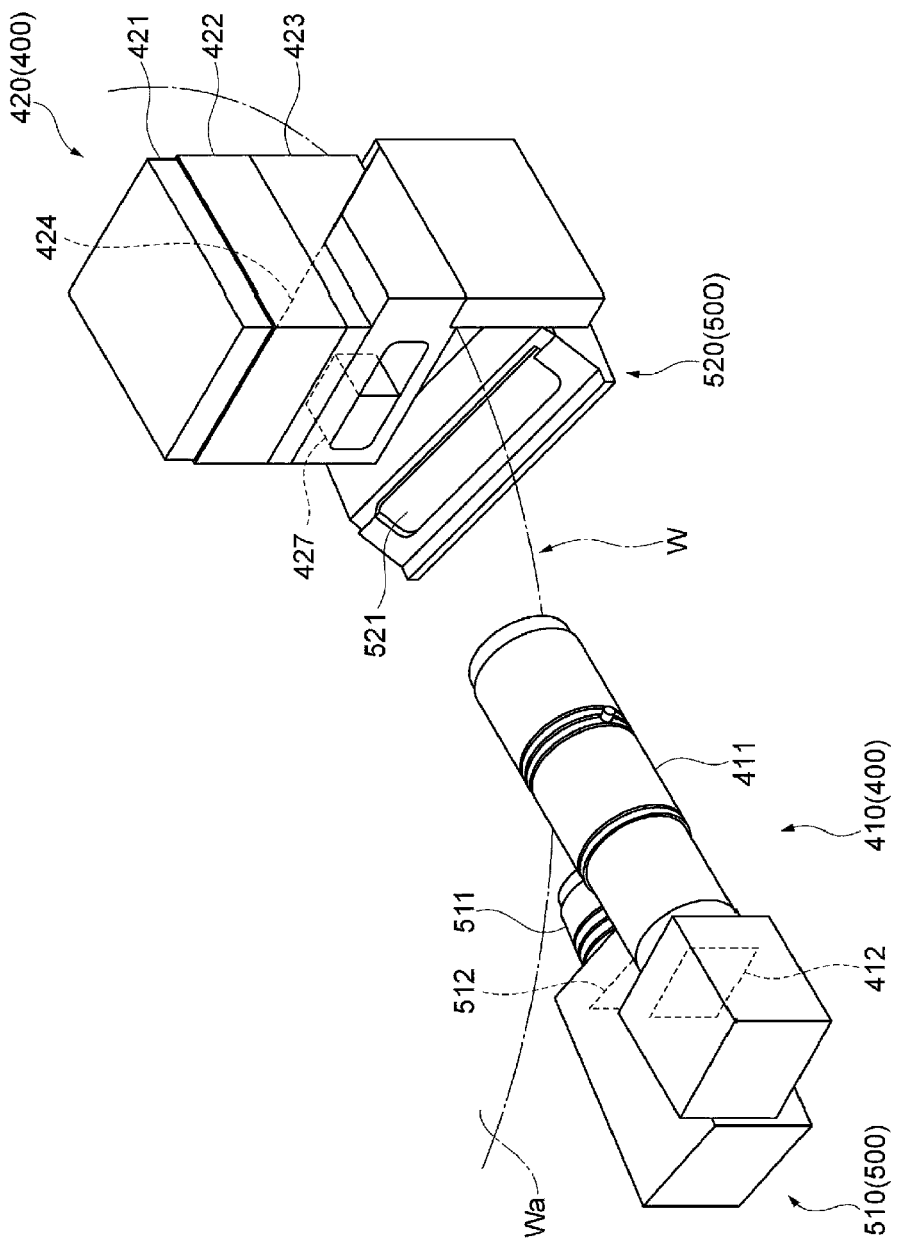
FIG. 10 is a rear side perspective view of the periphery imaging sub-unit in the substrate processing system according to the exemplary embodiment.
Figure 11:
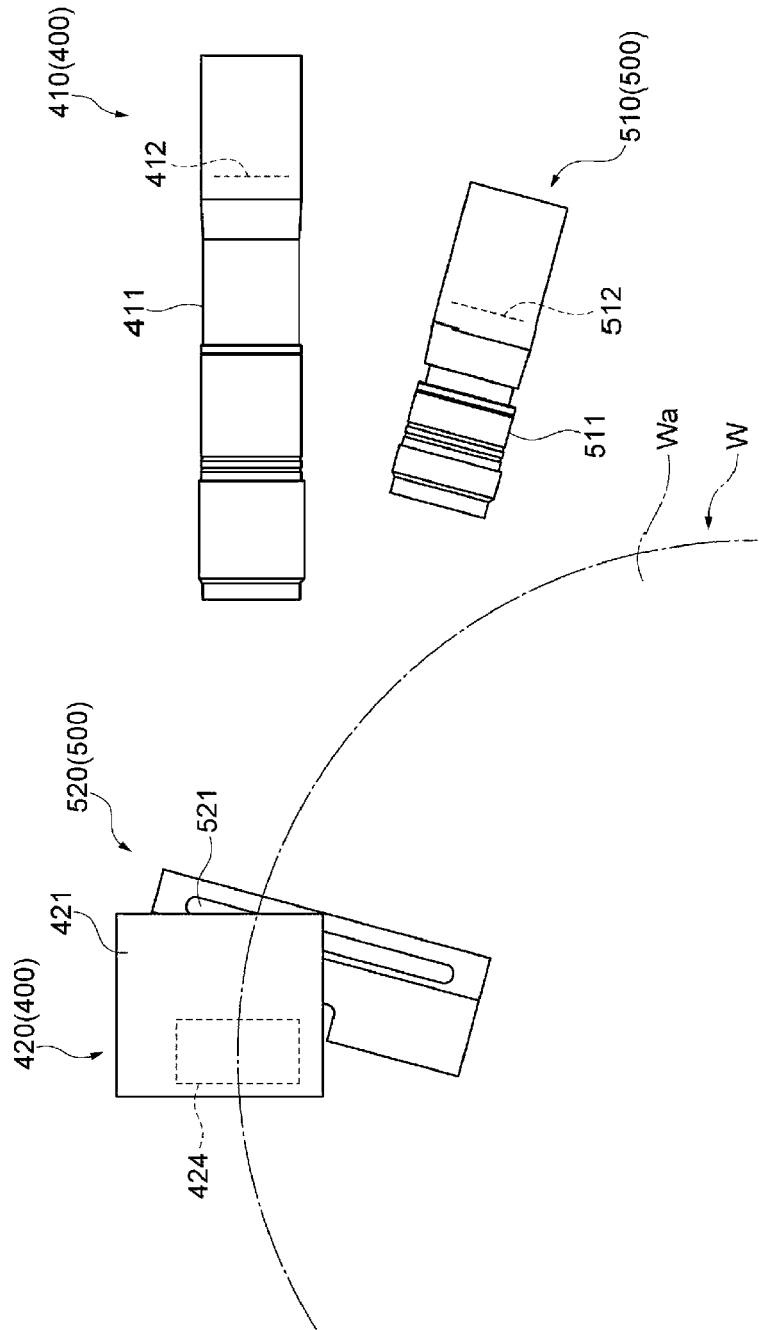
FIG. 11 is a top view of the periphery imaging sub-unit in the substrate processing system according to the exemplary embodiment.

As shown in FIG. 9 and FIG. 10, the focus adjusting lens 427 is provided in the intersection hole. As long as the focus adjusting lens 427 is a lens configured to change a composite focal length with the lens 411, it is not particularly limited. The focus adjusting lens 427 may be a lens having, e.g., a rectangular parallelepiped shape.

As shown in FIG. 9 and FIG. 12, the mirror member 430 is provided below the illuminating module 420. As shown in FIG. 9 and FIG. 12 to FIG. 14, the mirror member 430 has a body 431 and a reflection surface 432. The body 431 is made of an aluminum block.

As shown in FIG. 9 and FIG. 14, when the wafer W held by the holding table 201 is located at the second position, the reflection surface 432 is directed toward the end surface We of the wafer W and the peripheral portion Wd of the rear surface Wb of the wafer W. The reflection surface 432 is inclined with respect to the rotation axis of the holding table 201. The reflection surface 432 is mirror finished. For example, a mirror sheet may be attached to the reflection surface 432. Alternatively, an aluminum coating may be performed on the reflection surface 432, or an aluminum material may be deposited on the reflection surface 432.

The reflection surface 432 is a curved surface that is recessed away from the end surface Wc of the wafer W held on the holding table 201. That is, the mirror member 430 is a concave mirror. Thus, a mirror image of the end surface Wc of the wafer W reflected on the reflection surface 432 is larger than a real image. A radius of curvature of the reflection surface 432 may be, e.g., about 10 mm to 30 mm. An angular aperture θ (see FIG. 14) of the reflection surface 432 may be about 100° to 150°. Herein, the "angular aperture θ" of the reflection surface 432 refers to an angle formed between two planes circumscribed on the reflection surface 432.

Figure 15A:
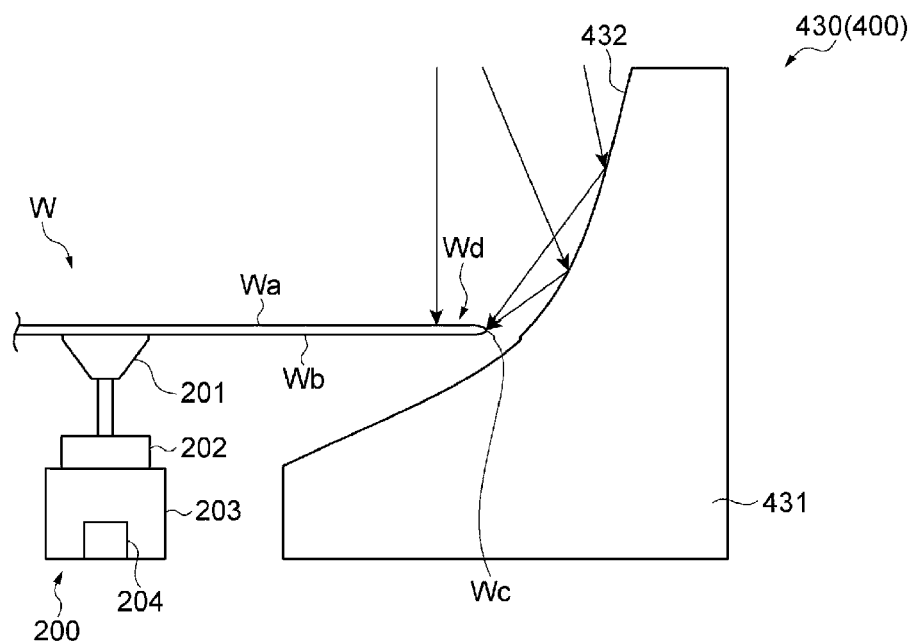
FIG. 15A is a diagram provided to explain a case where light from an illuminating module is reflected on the mirror member in the substrate processing system according to the exemplary embodiment.

In the illuminating module 420, light emitted from the light source 421 is scattered by the light scattering member 422, enlarged by the cylindrical lens 425, and diffused by the light diffusing member 426. Thereafter, the light passes through the whole half mirror 424 to be irradiated downwards. The diffused light having passed through the half mirror 424 is reflected by the reflection surface 432 of the mirror member 430 located below the half mirror 424. When the wafer W held on the holding table 201 is located at the second position, the diffused light having been reflected by the reflection surface 432 is mainly irradiated to the end surface Wc of the wafer W and the peripheral portion Wd of the front surface Wa, as shown in FIG. 15A. If the periphery of the wafer W has the bevel portion, the reflection light is irradiated particularly to an upper end of the bevel portion.

Figure 15B:
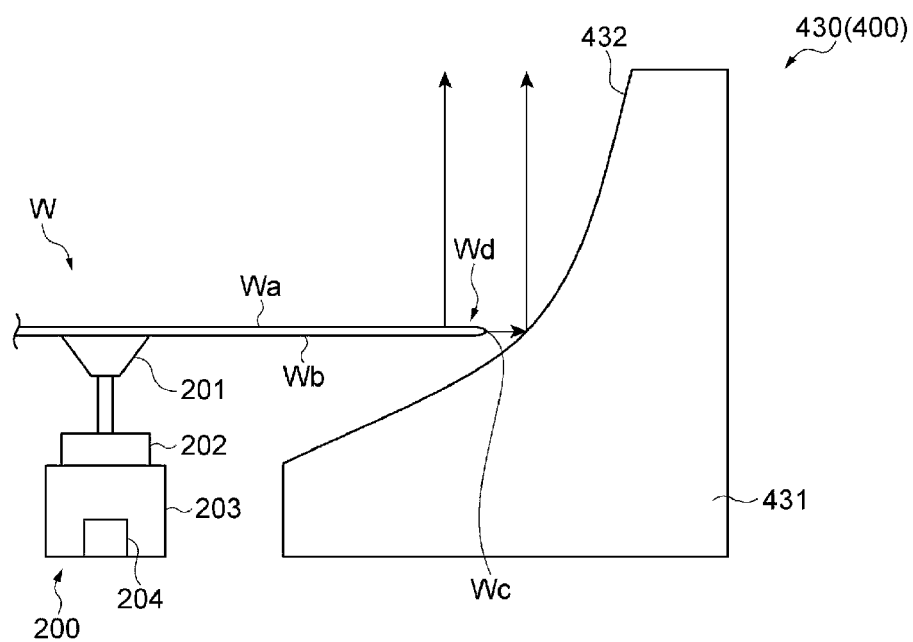
FIG. 15B is a diagram provided to explain a case where light from a wafer is reflected on the mirror member in the substrate processing system according to the exemplary embodiment.

The light having been reflected from the peripheral portion Wd of the front surface Wa of the wafer W is not directed toward the reflection surface 432 of the mirror member 430 but directly enters the half mirror 424 (see FIG. 15B). The light then passes through the lens 411 of the camera 410 to enter the imaging element 412 of the camera 410, without passing through the focus adjusting lens 427. On the other hand, the light having been reflected from the end surface Wc of the wafer W is directed toward the reflection surface 432 of the mirror member 430. The reflection light is reflected sequentially by the reflection surface 432 and the half mirror 424 and then enters the focus adjusting lens 427. The light coming from the focus adjusting lens 427 passes through the lens 411 of the camera 410 to enter the imaging element 412 of the camera 410. As such, the light reflected from the peripheral portion Wd of the wafer W and the light reflected from the end surface Wc of the wafer W enter the imaging element 412 along different optical paths, respectively. Thus, the optical path length of the light coming from the end surface Wc of the wafer W and reaching the imaging element 412 of the camera 410 is longer than the optical path length of the light coming from the peripheral portion Wd of the front surface Wa of the wafer W and reaching the imaging element 412 of the camera 410. A difference between these optical paths may be, e.g., about 1 mm to 10 mm. Thus, the imaging element 412 of the camera 410 receives both the light which comes from the peripheral portion Wd of the front surface Wa of the wafer W and the light which comes from the end surface Wc of the wafer W. That is, when the wafer W held by the holding table 201 is located at the second position, the camera 410 can take the images of both the peripheral portion Wd of the front surface Wa of the wafer W and the end surface Wc of the wafer W. Data on the images taken by the camera 410 are sent to the controller 10.

If the focus adjusting lens 427 is not provided, a part of the image taken by the camera 410 is likely to be unclear. For example, if the peripheral portion Wd of the front surface Wa of the wafer W is focused, the image of the peripheral portion Wd of the front surface Wa of the wafer W taken by the camera 410 is clear, but the image of the end surface Wc of the wafer W taken by the camera 410 is likely to be unclear due to the optical path difference. On the other hand, if the end surface Wc of the wafer W is focused, the image of the end surface Wc of the wafer W taken by the camera 410 is clear, but the image of the peripheral portion Wd of the front surface Wa of the wafer W taken by the camera 410 is likely to be unclear, due to the optical path difference. However, since the focus adjusting lens 427 is provided in the optical path of the reflection light extending from the reflection surface 432 of the mirror member 430 to the lens 411, the image formation position, at which the image of the end surface Wc of the wafer W is formed, can be adjusted onto the imaging element 412, even though there is the optical path difference. Thus, both the images of the peripheral portion Wd of the front surface Wa of the wafer W and the end surface Wc of the wafer W, which are taken by the camera 410, are clear.

As shown in FIG. 6 to FIG. 11 and FIG. 16, the rear surface imaging sub-unit 500 includes a camera 510 (imaging device) and an illuminating module 520 (illuminator). The camera 510 and the illuminating module 520 constitute a set of imaging modules. The camera 510 includes a lens 511 and one imaging element 512 (e.g., CCD image sensor, CMOS image sensor, etc.). The camera 510 is directed toward the illuminating module 520 (illuminator).

The illuminating module 520 is located below the illuminating module 420 and below the wafer W held by the holding table 201. As shown in FIG. 16, the illuminating module 520 includes a half mirror 521 and a light source 522. The half mirror 521 is inclined at about 45° with respect to the horizontal direction. The half mirror 521 has a rectangular shape.

The light source 522 is located below the half mirror 521. The light source 522 is longer than the half mirror 521. Light emitted from the light source 522 passes through the whole half mirror 521 to be irradiated upwards. The light having passed through the half mirror 521 is reflected by an object located above the half mirror 521 and is again reflected by the half mirror 521. Then, the light passes through the lens 511 of the camera 510 to enter the imaging element 512 of the camera 510. That is, the camera 510 can take an image of an object provided in an irradiation area of the light source 522 through the half mirror 521. For example, when the wafer W held by the holding table 201 is located at the second position, the camera 510 can take the image of the rear surface Wb of the wafer W. Data on the image taken by the camera 510 are sent to the controller 10.

Configuration of Periphery Exposure Unit

Figure 17:
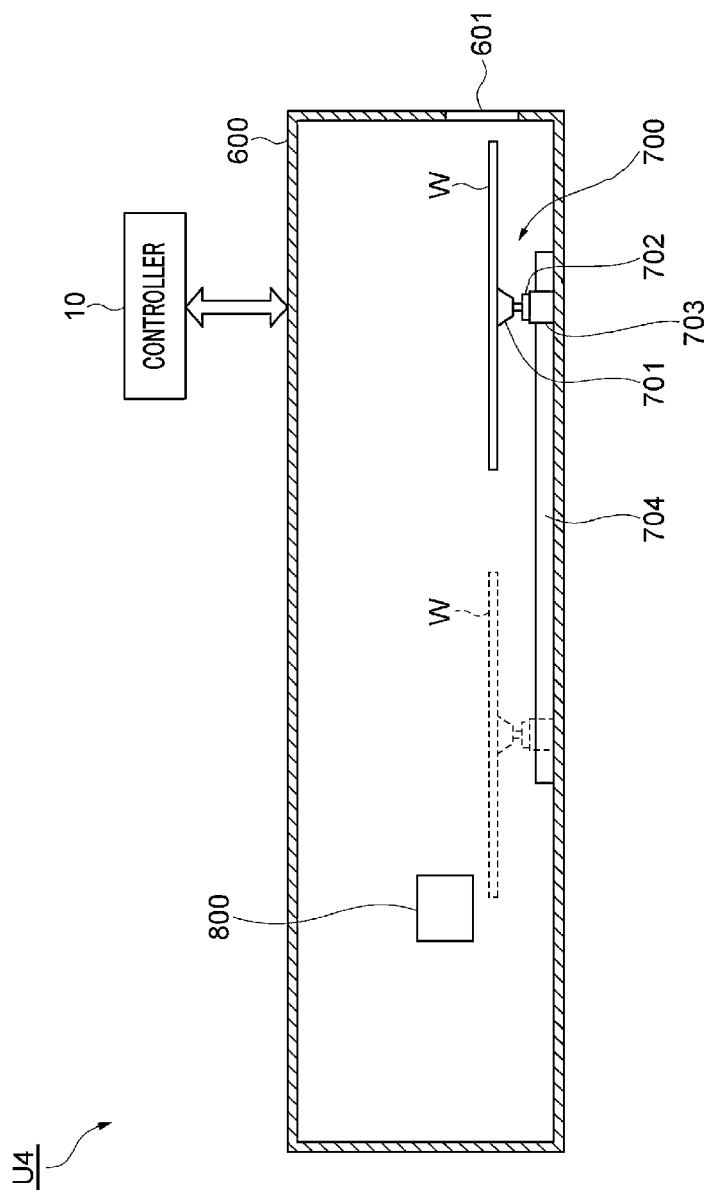
FIG. 17 is a side cross-sectional view of a periphery exposure unit in the substrate processing system according to the exemplary embodiment.

Hereinafter, the periphery exposure unit U4 will be described in more detail with reference to FIG. 17 and FIG. 18. As shown in FIG. 17, the periphery exposure unit U4 includes a housing 600, a rotary holder sub-unit 700 (rotary holder), and an exposure sub-unit 800 (irradiator). The sub-units 700 and 800 are disposed in the housing 600. A carry-in/out opening 601 through which the wafer W is carried into the housing 600 and carried out of the housing 600 is formed at one end wall of the housing 600.

Figure 18:
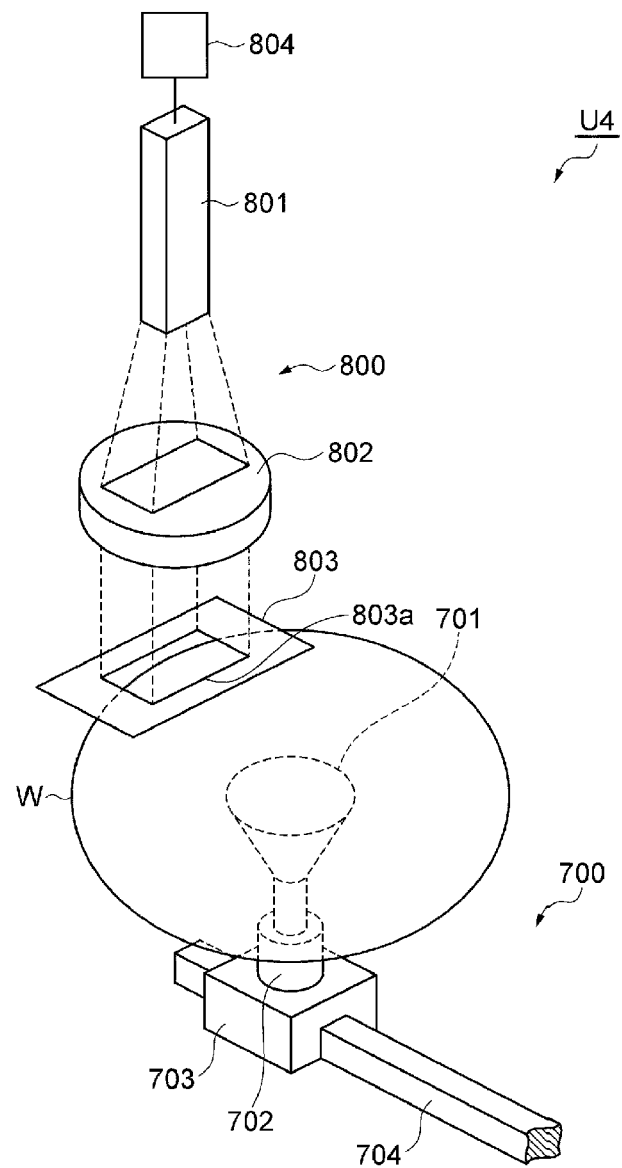
FIG. 18 is a perspective view of the periphery exposure unit in the substrate processing system according to the exemplary embodiment.

As shown in FIG. 17 and FIG. 18, the rotary holder sub-unit 700 includes a holding table 701, actuators 702, 703, and a guide rail 704. The holding table 701 is configured as a suction chuck configured to substantially horizontally hold the wafer W by, e.g., suction. The shape of the holding table 701 (suction chuck) is not particularly limited, and may be, e.g., circular. The size of the holding table 701 may be smaller than the wafer W, and may be substantially the same as those of the holder 22 (suction chuck) and the holding table 201 (suction chuck). If the holding table 701 has the circular shape, the holding table 701 (suction chuck) may have a size of, e.g., about 80 mm in diameter.

The actuator 702 is, e.g., an electric motor configured to rotate and drive the holding table 701. That is, the actuator 702 rotates the wafer W held on the holding table 701. The actuator 702 may include an encoder for detecting a rotational position of the holding table 701. In this case, the exposure position of the peripheral portion Wd of the wafer W to be exposed by the exposure sub-unit 800 and the rotational position can be related to each other.

The actuator 703 is, e.g., a linear actuator configured to move the holding table 701 along the guide rail 704. That is, the actuator 703 allows the wafer W held on the holding table 701 to be transferred between one end and the other end of the guide rail 704. Thus, the wafer W held on the holding table 701 can be moved between a first position near the carry-in/out opening 601 and a second position near the exposure sub-unit 800. The guide rail 704 extends linearly (e.g., like a straight line) in the housing 600.

The exposure sub-unit 800 is located above the rotary holder sub-unit 700. As shown in FIG. 18, the exposure sub-unit 800 includes a light source 801, an optical system 802, a mask 803, and an actuator 804. The light source 801 emits downwards (toward the holding table 701) energy beam (e.g., ultraviolet ray) having a wavelength component capable of exposing the resist film R. As the light source 801, an ultrahigh pressure UV lamp, a high pressure UV lamp, a low pressure UV lamp, an excimer lamp, or the like may be used.

The optical system 802 is located below the light source 801. The optical system 802 is composed of at least one lens. The optical system 802 converts the light from the light source 801 into approximately parallel light and then irradiates the parallel light onto the mask 803. The mask 803 is located below the optical system 802. The mask 803 has an opening 803a by which an exposure area is adjusted. The parallel light from the optical system 802 passes through the opening 803a to be irradiated to the peripheral portion Wd of the front surface Wa of the wafer W held by the holding table 701.

The actuator 804 is connected to the light source 801. The actuator 804 is, e.g., an elevation cylinder configured to move the light source 801 in the vertical direction. That is, the light source 801 can be moved by the actuator 804 between a first height position (lowered position) near the wafer W held by the holding table 701 and a second height position (raised position) away from the wafer W held by the holding table 701.

Configuration of Controller

Figure 19:
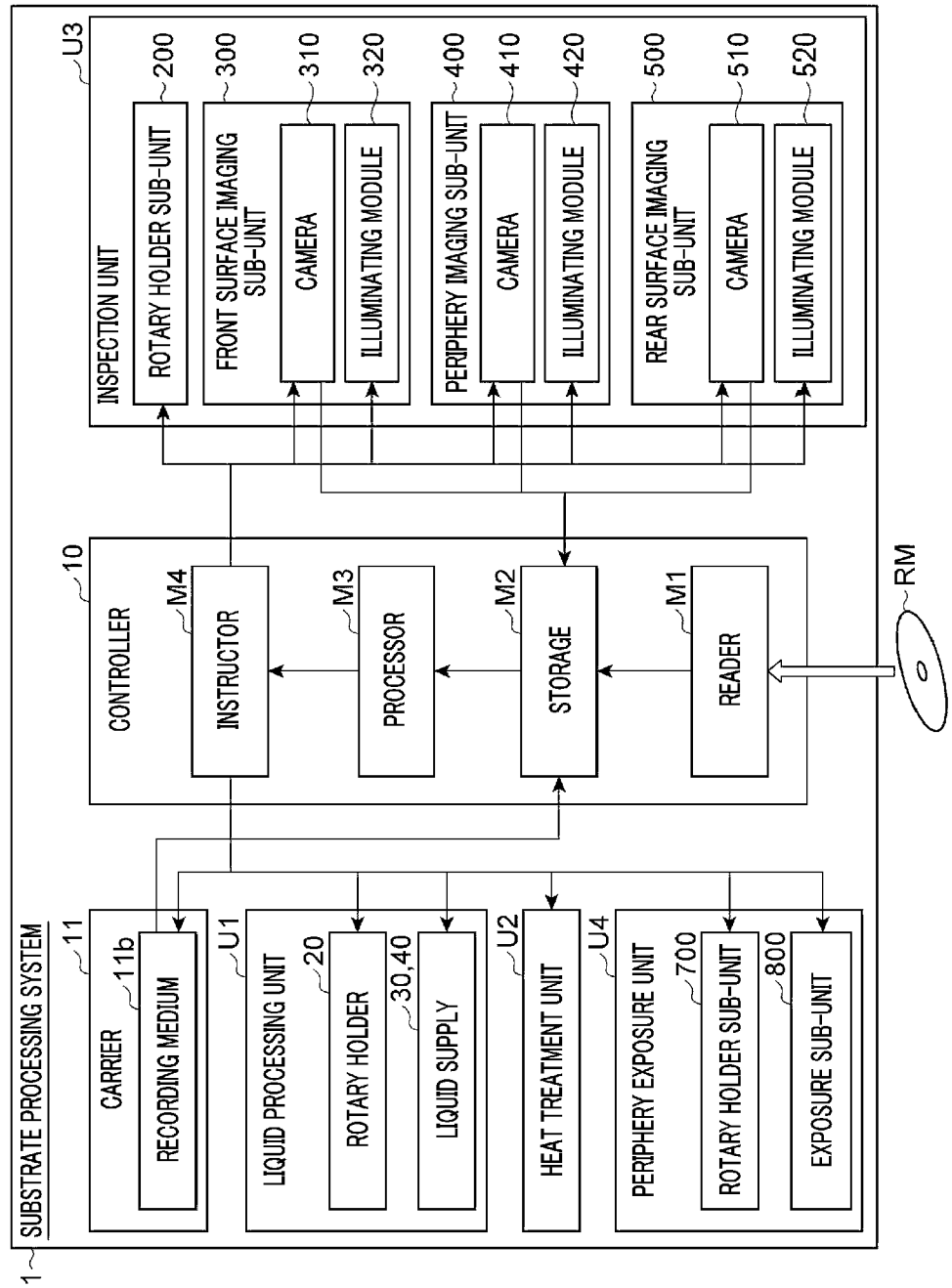
FIG. 19 is a block diagram illustrating main parts of the substrate processing system according to the exemplary embodiment.

As shown in FIG. 19, the controller 10 includes, as functional modules, a reader M1, a storage M2, a processor M3, and an instructor M4. These functional modules merely correspond to the functions of the controller 10 for the sake of conveniences, and do not necessarily mean that the hardware constituting the controller 10 is divided into a plurality of modules. The respective functional modules are not limited to modules whose functions are implemented by executing programs, but may be modules whose functions are implemented by a dedicated electric circuit (e.g., logic circuit) or an integrated circuit (ASIC: Application Specific Integrated Circuit) thereof.

The reader M1 is configured to read out a program from a computer-readable recording medium RM. The recording medium RM stores a program for operating respective components of the substrate processing system 1. That is, the recording medium RM stores a program for performing the substrate inspection method described in the present exemplary embodiment by the substrate inspection apparatus. The recording medium RM may be, e.g., a semiconductor memory, an optical memory disc, a magnetic memory disc, or a magneto optic memory disc. The recording medium RM may be a removable medium.

The storage M2 is configured to store various data. Examples of the data stored in the storage M2 may be, e.g., the program read out by the reader M1 from the recording medium RM, information on the wafer W read out from the recording medium 11b, and the like. Further, the storage M2 stores data on the images taken by the cameras 310, 410, and 510, various data when the processing liquids L1 and L2 are supplied to the wafer W (so-called process recipes), set data inputted by an operator through an external input apparatus (not shown), and the like.

The processor M3 is configured to process various data. For example, the processor M3 generates, based on the various data stored in the storage M2, operation signals for operating the liquid processing unit U1, the heat treatment unit U2, the inspection unit U3, and the periphery exposure unit U4. Examples of the liquid processing unit U1 may include the rotary holder 20, the liquid supplies 30 and 40, and the like. Further, examples of the inspection unit U3 may include the rotary holder sub-unit 200, the cameras 310, 410, and 510, the illuminating modules 320, 420, and 520, and the like. Furthermore, examples of the periphery exposure unit U4 may include the rotary holder sub-unit 700 and the exposure sub-unit 800. In addition, the processor M3 generates information on the wafer W based on the data on the images taken by the cameras 310, 410, and 510.

The instructor M4 is configured to output the operation signals generated by the processor M3 to various types of devices. The instructor M4 stores the information on the wafer W generated by the processor M3 in the storage medium 11b. The instructor M4 outputs, to the storage medium 11b, an instruction signal for reading out the information on the wafer W stored in the storage medium 11b.

Figure 20:
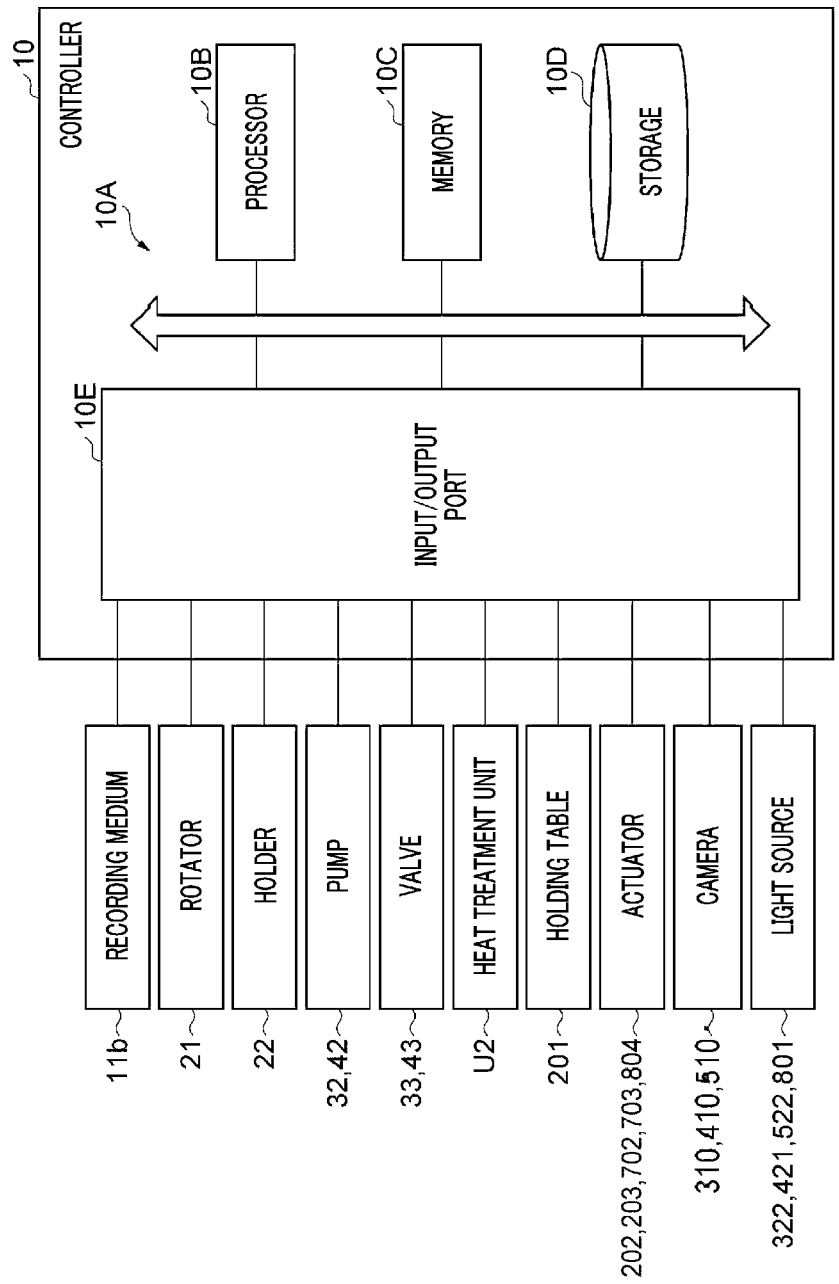
FIG. 20 is a schematic diagram illustrating a hardware structure of a controller in the substrate processing system according to the exemplary embodiment.

The hardware of the controller 10 is composed of, e.g., one or more control computers. The controller 10 has a circuit 10A as a hardware configuration, which is shown in FIG. 20. The circuit 10A may be formed of an electric circuitry. Specifically, the circuit 10A includes a processor 10B, a memory 10C (storage), a storage 10D (storage), and an input/output port 10E. The processor 10B cooperates with at least one of the memory 10C or the storage 10D to execute a program, so that a signal is inputted or outputted through the input/output port 10E. Thus, the above-described functional modules are implemented. The input/output port 10E inputs/outputs signals between the processor 10B, the memory 10C, and the storage 10D and the various devices of the substrate processing system 1. Examples of the various devices may include the storage medium 11b, the rotator 21, the holder 22, the pumps 32 and 42, the valves 33 and 43, the heat treatment unit U2, the holding tables 201 and 701, the actuators 202, 203, 702, 703, and 804, the cameras 310, 410, and 510, the light sources 322, 421, 522, and 801, and the like.

In the present exemplary embodiment, although the substrate processing system 1 includes one controller 10, the substrate processing system 1 may include a controller group (controller) composed of a plurality of controllers 10. When the substrate processing system 1 includes the controller group, each of the above-described functional modules may be implemented by the one controller 10, or may be implemented by a combination of two or more controllers 10. When the controller 10 is composed of a plurality of computers (circuits 10A), the above-described functional modules may be implemented by one computer (circuit 10A), or may be implemented by a combination of two or more computers (circuits 10A). The controller 10 may include a plurality of processors 10B. In this case, each of the above-described functional modules may be implemented by one processor 10B, or may be implemented by a combination of two or more processors 10B.

Further, in the present exemplary embodiment, the substrate processing system 1 has been described for the case of including the coating and developing apparatus 2 and the controller 10, but is not limited in this configuration. That is, the controller 10 may be configured as a PC or a server device which can access the coating and developing apparatus 2 from the outside. The controller 10 may function as a substrate inspection apparatus, i.e., a controller that controls the holding table and the camera. The controller 10 functioning as the substrate inspection apparatus is not necessarily integrated with the inspection unit U3, and may be implemented as an external device capable of performing wired or wireless communication if necessary. Even in this case, the controller 10 has the circuit 10A, as a hardware configuration, including the processor 10B, the memory 10C, the storage 10D, and the input/output port 10E.

Method of Calculating Profile Line of Reference Wafer

Figure 21:
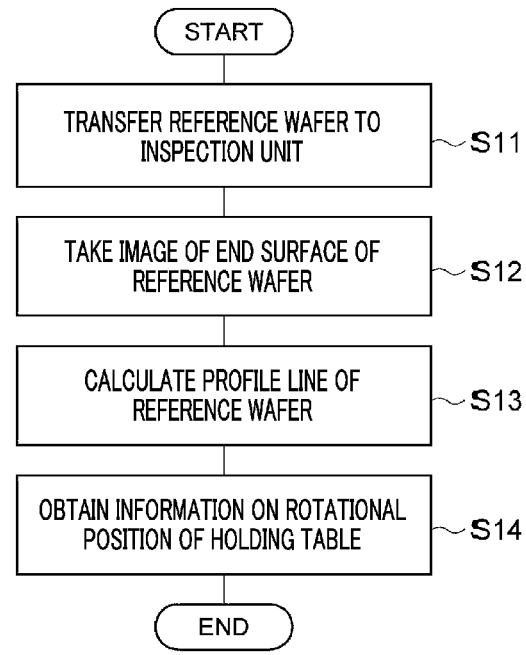
FIG. 21 is a flowchart provided to explain a sequence of calculating a profile line of a reference wafer in a substrate processing method according to the exemplary embodiment.

Hereinafter, a method of calculating a profile line of a reference wafer by using the inspection unit U3 will be described with reference to FIG. 21. The method of calculating the profile line of the reference wafer is a part of the inspection method of the wafer W (target substrate). Herein, the "reference wafer" means a wafer whose warpage amount (in particular, peripheral warpage amount) is known. The reference wafer may be a flat wafer. An evaluation index of the flatness of the wafer W may be, e.g., GBIR (Global Backside Ideal focal plane Range), SFQR (Site Frontside least sQuares focal plane Range), SBIR (Site Backside least sQuares focal plane Range), ROA (Roll Off Amount), ESFQR (Edge Site Frontside least Squares focal plane Range), ZDD (Z-height Double Differentiation), etc., which are defined by SEMI (Semiconductor equipment and materials international) standard. The reference wafer may have a flatness in which a maximum value of SFQR is, e.g., about 100 nm or a flatness in which a maximum value of SFQR is, e.g., about 42 nm. Otherwise, the reference wafer may have a flatness in which a maximum value of SFQR is, e.g., about 32 nm or a flatness in which a maximum value of SFQR is, e.g., about 16 nm.

Due to the deflection of the holding table 201 or the like, the wafer W rotated by the holding table 201 may rotate eccentrically and the periphery of the wafer W may be deflected vertically. The deflection of the holding table 201 may be caused by the deflection of the rotation axis, the mechanical assembly error of the rotary holder sub-unit 200, and the error of the suction surface of the holding table 201, and the like. The reference wafer is used to obtain a reference value of the vertical deflection of the wafer W on the rotary holder sub-unit 200. Data on the reference value may be obtained by using the reference wafer before the wafer W is processed in the substrate processing system 1. Alternatively, data on the reference value may be obtained by using the reference wafer after maintenance (adjustment, cleaning, etc.) of the substrate processing system 1. Alternatively, data on the reference value may be periodically obtained by using the reference wafer. A precise warpage amount of the wafer W to be actually processed (target wafer) can be determined by comparing the inspection data on the target wafer W obtained by using the inspection unit U3 with the reference value data.

First, the controller 10 controls each of the components of the substrate processing system 1 to transfer the reference wafer into the inspection unit U3 (process S11). Then, the controller 10 controls the rotary holder sub-unit 200 to hold the reference wafer on the holding table 201. Then, the controller 10 controls the rotary holder sub-unit 200 to move the holding table 201 by the actuator 203 from the first position to the second position along the guide rail 204. Thus, the peripheral portion of the reference wafer is positioned between the illuminating module 420 and the mirror member 430.

Then, the controller 10 controls the rotary holder sub-unit 200 to rotate the holding table 201 by the actuator 202. Thus, the reference wafer is rotated. In this state, the controller 10 controls the periphery imaging sub-unit 400 to turn on the light source 421 and take the image by the camera 410 (process S12). In this manner, the image of the end surface of the reference wafer is taken over an entire circumference of the periphery of the reference wafer.

Then, based on the image of the end surface of the reference wafer obtained in process S12, the profile line of the reference wafer is calculated by the processor M3 (process S13). To be specific, the controller 10 makes the processor M3 determine the upper edge and the lower edge of the end surface of the reference wafer from the image based on, e.g., the contrast difference. Then, the controller 10 makes the processor M3 determine, as the profile line, a line passing through the middle positions between the upper edge and the lower edge. Thus, the shape of the end surface of the reference wafer is obtained.

Herein, if the profile line of the reference wafer is calculated using the inspection unit U3, information on the rotational position of the holding table 201 with respect to the profile line is obtained (process S14). In many cases, a stop position of the holding table 201 when the rotating of the holding table 201 is stopped (rotational position when stopped) is not particularly limited. For this reason, the stop position of the holding table 201 when stopped is not checked by a typical inspection unit. In this regard, the inspection unit U3 described in the present exemplary embodiment can check the rotational position of the holding table 201 and relate the profile line to the information on the rotational position of the holding table 201.

Examples of the rotational position of the holding table 201 may include information that specifies the position of the reference point of the holding table 201. For example, a set point of the rotation (reference point) of the holding table 201 is previously set. Then, while the holding table 201 holding the reference wafer thereon is rotated 360°, the image of the end surface of the reference wafer is taken. In this case, the time when the image of the end surface of the reference wafer held at the reference point of the holding table 201 or a predetermined position of the holding table 201 corresponding to the reference point is taken is specified. Herein, "the time when the image of the end surface of the reference wafer is taken" means how many rotations have been made after the imaging processing is started. By specifying it, the information on the rotational position of the holding table 201 corresponding to the profile line can be obtained.

Further, the information on the rotational position of the holding table 201 is used when the wafer inspection is performed using the above-described profile line. A method of obtaining the information on the rotational position of the holding table 201 when the image of the end surface of the reference wafer is taken (i.e., a method of checking the position of the reference point of the holding table 201) is not particularly limited. For example, if the actuator 202 includes the encoder for detecting the rotational position of the holding table 201, the position of the reference point can be specified based on the information obtained from the encoder or the position of the reference point may be specified without using the encoder. A sensor configured to detect the rotational position of the holding table 201 may be provided in the holding table 201 or around the holding table 201, and the information on the rotational position of the holding table 201 obtained from the sensor may be used as the information on the rotational position. The information on the rotational position obtained by the sensor is sent to the processor M3 and thus can be related to the profile line of the reference wafer. If the sensor is not used, a component for specifying the position of the reference point of the holding table 201 may be previously provided on the front surface (upper surface) of the holding table 201 and may be used to specify the position of the reference point of the holding table 201 before the reference wafer is held thereon. To be specific, an opening for specifying the position of the reference point of the holding table 201 may be formed and the image of the holding table 201 before the reference wafer is held thereon may be taken by the front surface imaging sub-unit 300. Thus, it is possible to specify the position of the reference point of the holding table 201 before the reference wafer is held thereon. Therefore, it is also possible to hold the information on the rotational position of the holding table 201 when the holding table 201 on which the reference wafer is held is rotated. Further, a method of obtaining the information on the rotational position of the holding table 201 is not limited to the above-described methods.

As described above, a method of obtaining the information on the rotational position of the holding table 201 is not particularly limited. Therefore, a timing for obtaining the information on the rotational position of the holding table 201 (S14) is not particularly limited. For example, the information on the rotational position of the holding table 201 may be obtained before the reference wafer is transferred into the inspection unit (S11) or at the same time when the image of the end surface of the reference wafer is taken (S12).

Wafer Processing Method

Figure 22:
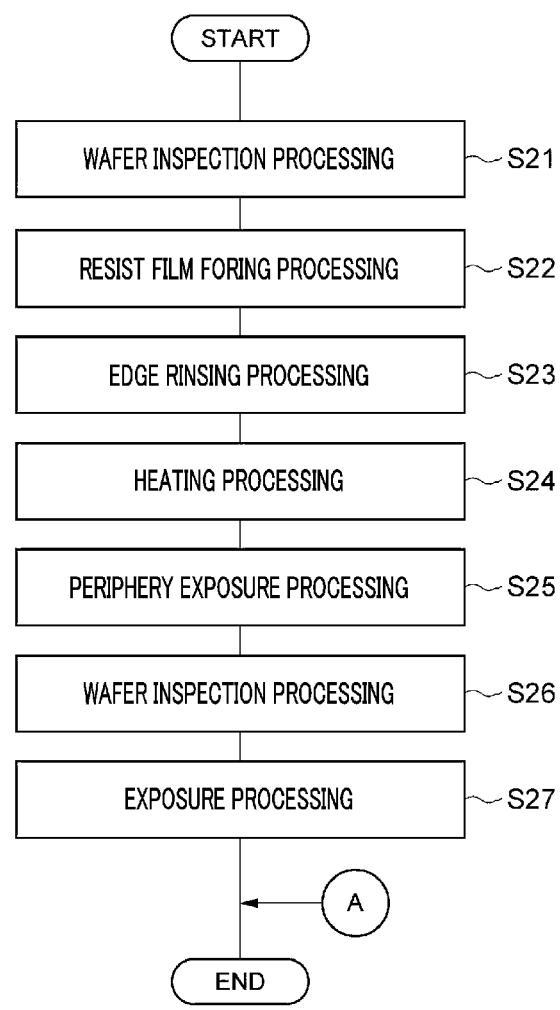
FIG. 22 is a flowchart provided to explain an example of a sequence of processing the wafer in the substrate processing method according to the exemplary embodiment.

Hereinafter, a processing method of the wafer W will be described with reference to FIG. 22. First, the controller 10 controls each of the components of the substrate processing system 1 to transfer the wafer W from the carrier 11 to the inspection unit U3 where the wafer W is subjected to an inspection processing (process S21). In the inspection processing of the wafer W, the warpage amount of the wafer W is calculated, details of which will be described later. The calculated warpage amount is related to the wafer W to be stored in the storage M2.

Then, the controller 10 controls each of the components of the substrate processing system 1 to transfer the wafer W to the liquid processing unit U1 where the resist film R is formed on the front surface Wa of the wafer W (process S22). To be specific, the controller 10 controls the rotary holder 20 to hold the wafer W by the holder 22 and rotate the wafer W at a predetermined rotation number. In this state, the controller 10 controls the pump 32, the valve 33, and the nozzle 34 (more specifically, the drive unit that drives the nozzle 34). To be specific, under the control of the controller 10, by discharging the processing liquid L1 (resist liquid) from the nozzle 34 onto the front surface Wa of the wafer W, the coating film in an unsolidified state (unsolidified film) is formed all over the front surface Wa of the wafer W.

Then, the controller 10 controls each of the components of the substrate processing system 1 to remove a part of the unsolidified film (peripheral portion of the unsolidified film) located at the peripheral portion Wd of the wafer W (a so-called edge rinsing processing is performed) (process S23). To be specific, the controller 10 controls the rotary holder 20 to hold the wafer W by the holder 22, and rotate the wafer W at a predetermined rotation number (e.g., about 1500 rpm). In this state, the controller 10 controls the pump 42, the valve 43, and the nozzle 44 (more specifically, the drive unit that drives the nozzle 44). To be specific, under the control of the controller 10, by discharging the processing liquid L2 (thinner which is an organic solvent) from the nozzle 44 onto the peripheral portion Wd of the front surface Wa of the wafer W, the peripheral portion of the unsolidified film is dissolved.

Then, the controller 10 controls each of the components of the substrate processing system 1 to transfer the wafer W from the liquid processing unit U1 to the heat treatment unit U2. Then, the controller 10 controls the heat treatment unit U2 to heat the unsolidified film together with the wafer W (so-called "PAB") to form the unsolidified film into a solidified film (resist film R) (process S24).

If the periphery of the wafer W is warped, the height position of the periphery of the wafer W may be changed during the rotation of the wafer W. If the height position of the periphery of the wafer W is changed, when the edge rinsing processing is performed, a removal width of the resist film R may be changed. Herein, the removal width is a linear distance between the periphery of the wafer W and the periphery of the resist film R measured in the diametrical direction of the wafer W, when seen from the front surface Wa of the wafer W.

Thus, in process S23, the controller 10 reads out the warpage amount of the periphery of the wafer W, which is calculated in process S21, from the storage M2, and determines, based on the warpage amount, the supply position of the processing liquid L2 by the nozzle 44 onto the peripheral portion of the resist film R. A setting value of the removal width is previously set in the process recipe of the liquid processing unit U1 on the assumption that the wafer W is not warped. Thus, the controller 10 corrects the setting value based on the warpage amount, such that the actual removal width of the peripheral portion of the unsolidified film has a desired value. Examples of the setting value to be corrected may include the position of the discharge opening of the nozzle 44, the moving speed of the nozzle 44 relative to the wafer W, the discharging flow rate of the processing liquid L2 from the nozzle 44, and the like.

In this manner, while changing the supply position of the processing liquid L2 by the nozzle 44 for each of the different wafers, the processing liquid L2 (organic solvent) is discharged from the nozzle 44 onto the peripheral portion Wd of the front surface Wa of the wafer W.

Then, the controller 10 controls each of the components of the substrate processing system 1 to transfer the wafer W from the heat treatment unit U2 to the periphery exposure unit U4 where the wafer W is subjected to a periphery exposure processing (process S25). To be specific, the controller 10 controls the rotary holder sub-unit 700 to hold the wafer W by the holding table 701 and rotate the wafer W at a predetermined rotation number (e.g., about 30 rpm). In this state, the controller 10 controls the exposure sub-unit 800 to irradiate a predetermined energy beam (ultraviolet ray) from the light source 801 to the resist film R located at the peripheral portion Wd of the front surface Wa of the wafer W. If the center axis of the holding table 701 and the center axis of the wafer W do not coincide with each other, the wafer W is eccentrically rotated on the holding table 701. For this reason, the controller 10 may control the actuator 703 to move the holding table 701 along the guide rail 704 depending on the eccentric amount of the wafer W.

When the periphery of the wafer W is warped, the height position of the periphery of the wafer W may be changed during the rotation of the wafer W. If the height position of the periphery of the wafer W is changed, when the peripheral portion Wd of the front surface Wa of the wafer W is irradiated with the energy beam, the exposure amount of the peripheral portion Wd may be insufficient.

Thus, in process S25, the controller 10 reads out the warpage amount of the periphery of the wafer W, which is calculated in process S21, from the storage M2, and determines, based on the warpage amount, the position of the exposure sub-unit 800 relative to the peripheral portion Wd. A setting value of the exposure width is previously set in the process recipe of the periphery exposure unit U4 on the assumption that the wafer W is not warped. Thus, the controller 10 corrects the setting value based on the warpage amount, such that the actual exposure width of the peripheral portion of the resist film R has a desired value. Examples of the setting value to be corrected may include the horizontal position of the wafer W relative to the exposure sub-unit 800, a separation distance (optical path length) between the wafer W and the exposure sub-unit 800, and the like.

In this manner, while changing the position of the exposure sub-unit 800 relative to the wafer W for each of the different wafers W, the peripheral portion Wd of the front surface Wa of the wafer W is irradiated with the energy beam. When one wafer W is subjected to the periphery exposure processing, since the rotation number of the wafer W is relatively low (e.g., about 30 rpm), the position of the exposure sub-unit 800 relative to the wafer W may be determined based on the warpage amount relative to with respect to coordinates of the periphery of the wafer W.

Then, the controller 10 controls each of the components of the substrate processing system 1 to transfer the wafer W from the periphery exposure unit U4 to the inspection unit U3 where the wafer W is subjected to an inspection processing (process S26). The inspection processing of the wafer W in this process is the same as that of process S21, and details thereof will be described later.

Then, the controller 10 controls each of the components of the substrate processing system 1 to transfer the wafer W from the inspection unit U3 to the exposure apparatus 3 where the wafer W is subjected to an exposure processing (process S27). To be specific, in the exposure apparatus 3, the resist film R formed on the front surface Wa of the wafer W is irradiated with a predetermined energy beam in a predetermined pattern. Thereafter, a resist pattern is formed on the front surface Wa of the wafer W through a developing processing in the unit processing block 17.

Wafer Inspection Method

Figure 23:
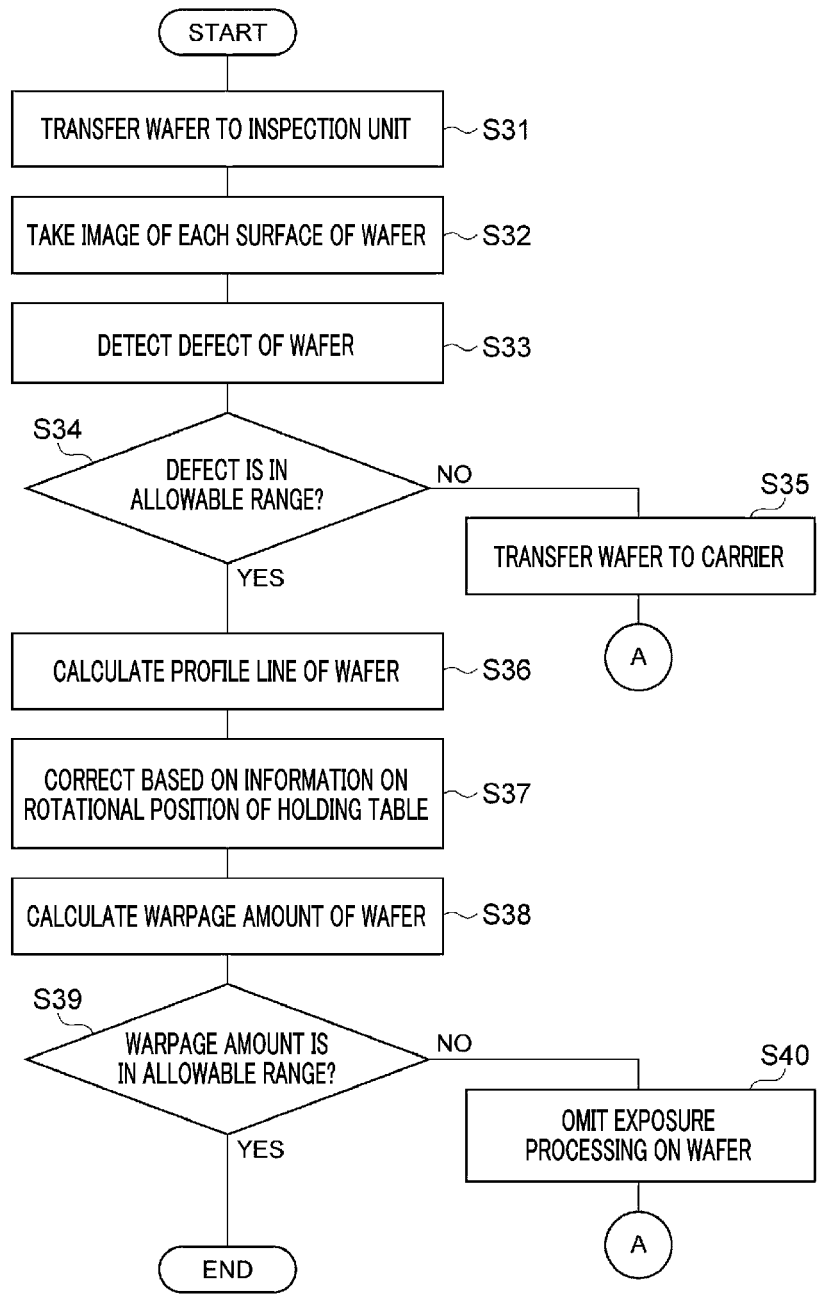
FIG. 23 is a flowchart provided to explain a sequence of inspecting the wafer in the substrate processing method according to the exemplary embodiment.

Hereinafter, the inspection method of the wafer W (target substrate) will be described in detail with reference to FIG. 23. First, the controller 10 controls each of the components of the substrate processing system 1 to transfer the wafer W to the inspection unit U3 (process S31). Then, the controller 10 controls the rotary holder sub-unit 200 to hold the wafer W by the holding table 201. Then, the controller 10 controls the rotary holder sub-unit 200 to move the holding table 201 by the actuator 203 from the first position to the second position along the guide rail 204. At this time, the controller 10 controls the front surface imaging sub-unit 300 to turn on the light source 322 and take the image by the camera 310 (process S32; an imaging processing of the front surface Wa of the wafer W). Thus, the image of the whole front surface Wa of the wafer W is taken. When the wafer W reaches the second position and the imaging processing by the camera 310 is completed, the data on the image taken by the camera 310 are sent to the storage M2. When the imaging processing by the camera 310 is completed, the peripheral portion of the wafer W is positioned between the illuminating module 420 and the mirror member 430.

Then, the controller 10 controls the rotary holder sub-unit 200 to rotate the holding table 201 by the actuator 202. Thus, the wafer W is rotated. In this state, the controller 10 controls the periphery imaging sub-unit 400 to turn on the light source 421 and take the image by the camera 410 (process S32; an imaging processing of the end surface Wc of the wafer W and an imaging processing of the peripheral portion Wd of the front surface Wa of the wafer W). Thus, the image of the end surface Wc of the wafer W and the image of the peripheral portion Wd of the front surface Wa of the wafer W are taken over the entire circumference of the periphery of the wafer W. At the same time, the controller 10 controls the rear surface imaging sub-unit 500 to turn on the light source 522 and take the image by the camera 510 (process S32; an imaging processing of the rear surface Wb of the wafer W). Thus, the image of the rear surface Wb of the wafer W is taken. After the wafer W has been rotated one time and the imaging processing by the cameras 410 and 510 is completed, the data on the images taken by the cameras 410 and 510 are sent to the storage M2.

In a subsequent process, the profile line of the wafer is calculated from the data on the image of the end surface Wc of the wafer W (process S36 to be described later). In this case, as in the reference wafer, the information on the rotational position of the holding table 201 related to the profile line of the wafer W needs to be obtained. For this reason, when the image of the end surface Wc of the wafer W is taken, the information on the rotational position of the holding table 201 is obtained.

Examples of the information on the rotational position of the holding table 201 may include the information for specifying the position of the reference point of the holding table 201, which is identical to the information on the rotational position of the holding table 201 related to the profile line of the reference wafer. When the holding table 201 holding the reference wafer thereon is rotated 360° and the image of the end surface Wc of the reference wafer W is taken, the time when the image of the end surface Wc corresponding to the reference point of the holding table 201 is taken (how many rotations have been made after the imaging processing is started) is specified. Thus, the information on the rotational position of the holding table 201 related to the profile line, which will be described later, can be obtained.

The method of obtaining the information on the rotational position of the holding table 201 when the image of the end surface Wc of the wafer W is taken (i.e., the method of checking the position of the holding table 201) is not particularly limited, which is the same as when the profile line of the reference wafer is calculated. Since the information on the rotational position is obtained in the same order as when the profile line of the reference wafer is calculated, it is possible to suppress the complexity of the processing of specifying the position of the reference point.

Then, the controller 10 makes the processor M3 process the data on the images, which are taken in process S32, so as to detect defects of the wafer W (process S33). The defect detection by the image processing can be performed in various ways, and the defects may be detected based on, e.g., the contrast difference. The controller 10 makes the processor M3 determine the type of the defect (for example, flaw, crack, scratch, insufficient formation of the coating film, etc.) based on the size, the shape, the location, etc., of the detected defect.

Then, the controller 10 makes the processor M3 determine whether the defect detected in process S33 is in an allowable range or not. If it is determined that the wafer W has the unallowable defect (NO in process S34), the wafer W is not subjected to a subsequent processing, and the controller 10 controls each of the components of the substrate processing system 1 to transfer the wafer W to the carrier 11 (process S35). Thus, the wafer W is not subjected to the exposure processing in process S26 (see mark "A" in FIG. 22 and FIG. 23).

On the other hand, if it is determined that the wafer W has no defect or the wafer W has the allowable defect (YES in process S34), the wafer W is subjected to the subsequent processing. That is, the controller 10 makes the processor M3 calculate the profile line of the wafer W based on the image of the end surface Wc of the wafer W obtained in the process S32 (process S36). To be specific, the controller 10 recognizes the upper edge and the lower edge of the end surface Wc of the wafer W from the image based on, e.g., the contrast difference. Then, the controller 10 makes the processor M3 determine, as the profile line, a line passing through the middle positions between the upper edge and the lower edge. Thus, the shape of the end surface Wc of the wafer W is obtained. Herein, the information on the rotational position of the holding table 201 with respect to the profile line is obtained, which is the same as when the profile line of the reference wafer is calculated. As described above, when the image of the end surface Wc of the wafer W is taken, the information on the rotational position of the holding table 201 is obtained. This information may be used to relate the profile line of the end surface Wc of the wafer W to the information on the rotational position of the holding table 201.

Then, the controller 10 corrects the profile line based on the rotational position of the holding table 201 (process S37). In this case, the information on the rotational position related to the profile line of the reference wafer and the information on the rotational position related to the profile line of the wafer W, whose warpage amount is to be calculated, are used.

Then, the controller 10 makes the processor M3 calculate the warpage amount of the wafer W by correcting the profile line obtained in the process S36 using the profile line previously obtained in the process S13 (process S38). To be specific, the controller 10 makes the processor M3 calculate a difference in the profile line by subtracting the profile line of the reference wafer from the profile line of the wafer W and calculate the warpage amount of the wafer W at each coordinates (each angle). The result (difference) of the subtraction of the profile line of the reference wafer from the profile line of the wafer W corresponds to the warpage amount.

Figure 24:
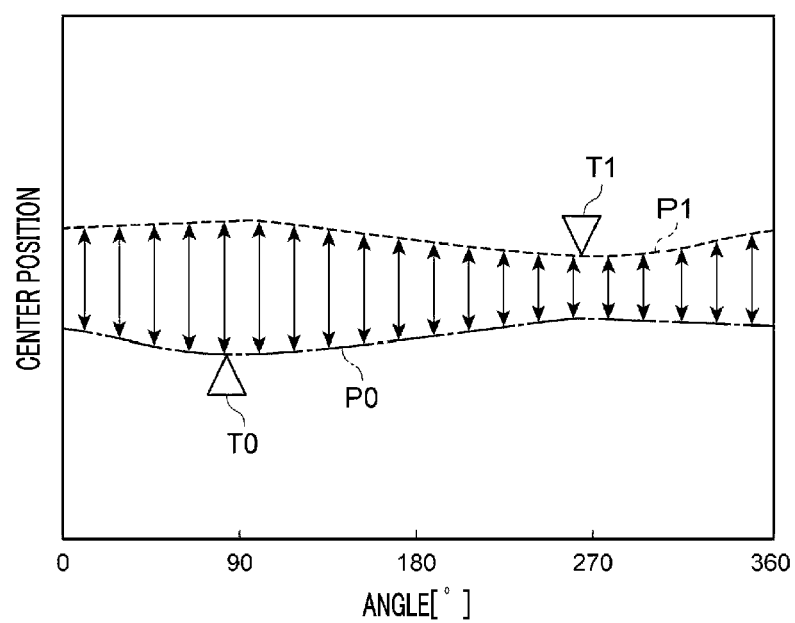
FIG. 24 is a diagram explaining a method of calculating a warpage amount in the substrate processing method according to the exemplary embodiment and explaining a case where a correction to a rotational position of a holding table is not made.

The processing performed in the process S37 and the processing performed in the process S38 will be described in more detail. FIG. 24 shows a profile line P0 of the reference wafer and a profile line P1 of the wafer W which are calculated from the image data. In FIG. 24, the angle on the horizontal axis represents a rotational angle of the holding table 201 after the imaging processing of the end surface of the wafer is started. Further, FIG. 24 shows a position T0 of the reference point of the holding table 201 as the information on the rotational position of the holding table 201 related to the profile line P0. When the profile line P0 of the reference wafer is obtained, the position T0 of the reference point of the holding table 201 appears around 70°. Likewise, FIG. 24 shows a position T1 of the reference point of the holding table 201 as the information on the rotational position of the holding table 201 related to the profile line P1. When the profile line P1 of the wafer W whose warpage amount is to be calculated is obtained, the position T1 of the reference point of the holding table 201 appears around 250°. As such, the position of the reference point of the holding table 201 is different between when the profile line P0 is obtained and when the profile line P1 is obtained.

Both the profile line P0 and the profile line P1 shown in FIG. 24 have components about a change in the height position caused by the inclination of the holding table 201 or the like. For example, when the holding table 201 is slightly inclined with respect to the horizontal direction, even if the wafer placed on the holding table 201 is flat, the profile line affected by the inclination of the holding table 201 is obtained. Therefore, it is assumed that both the profile line P0 and the profile line P1 have the inclinations caused by the rotational position of the holding table 201. Herein, the position of the reference point of the holding table 201 is different between when the profile line P0 is obtained and when the profile line P1 is obtained. For this reason, there is a difference in effect caused by the inclinations of the holding table 201 between in the profile line P0 and in the profile line P1 even at the same angle on the horizontal axis shown in FIG. 24.

Herein, assuming that the profile line of the reference wafer is subtracted from the profile line of the wafer W in the data obtained at the same angle on the horizontal axis without the correction based on the rotational position of the holding table 201 described in the process S37. In this case, the subtraction is performed between the data affected by the inclinations at the different rotational positions of the holding table 201. Thus, the difference data also include the component about the inclination depending on the rotational position of the holding table 201.

Figure 25:
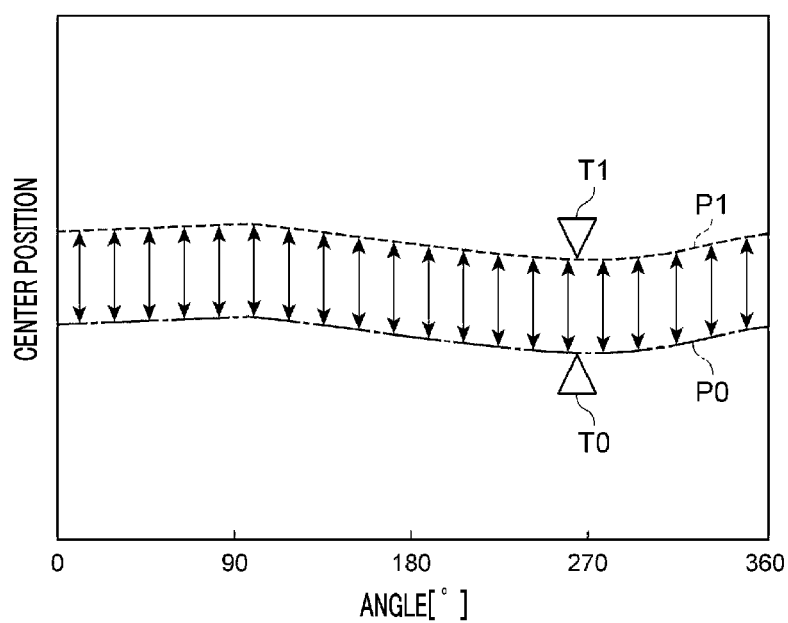
FIG. 25 is a diagram explaining a method of calculating the warpage amount in the substrate processing method according to the exemplary embodiment and explaining a case where the correction to the rotational position of the holding table is made.

Then, the correction based on the rotational position of the holding table 201 described in the process S37 is performed. To be specific, as shown in FIG. 25, the profile line P0 is moved along the horizontal axis direction such that the position T0 of the reference point and the position T1 of the reference point are at the same angle on the horizontal axis. Since the profile lines shown in FIG. 24 and FIG. 25 correspond to one circumference of the end surface of the wafer, 0° and 360° are identical on the horizontal axis, and the data are moved (slid) along the horizontal axis direction. Then, in the process S38, the profile line of the reference wafer is subtracted from the profile line of the wafer W in the data obtained at the same angle on the horizontal axis. In this case, the subtraction is performed between the profile lines corrected based on the rotational position of the holding table 201. That is, the subtraction is performed between the data obtained at the same rotational position of the holding table 201. Thus, the difference data do not have the component about the inclination depending on the rotational position of the holding table 201. Therefore, the warpage amount relative to the coordinates (angle) of the wafer W after the subtraction may not include the component caused by the inclination of the holding table 201 or may include the component whose amount is greatly reduced.

Returning to FIG. 23, the controller 10 makes the processor M3 determine whether the warpage amount obtained in the process S38 is within an allowable range or not. The allowable range of the warpage amount may be set by, e.g., a value in an overlay (OL) control of the exposure apparatus 3. If it is determined that the warpage amount is too large to be allowed (NO in the process S39), the controller 10 makes the storage M2 store information indicating that the exposure processing on the wafer W is omitted, in relation to the corresponding wafer W (process S39). For this reason, the exposure processing of the process S26 is not performed on the wafer W (see mark "A" in FIG. 22 and FIG. 23).

On the other hand, if it is determined that the warpage amount is small and allowable (YES in the process S39), the controller 10 completes the inspection processing. At this time, the controller 10 controls each of the components of the substrate processing system 1 to transfer the wafer W from the inspection unit U3 to the exposure apparatus 3.

Operation

In the present exemplary embodiment, when the warpage amount of the wafer W is calculated in the process S38, the warpage amount is calculated by correcting the profile line P1 of the wafer W using the profile line P0 of the reference wafer. In this case, the correction in the process S37 is performed based on the information on the rotational position of the holding table. For this reason, it is possible to suppress a component corresponding to a displacement depending on the rotational position of the holding table 201 from being included in the warpage amount. Therefore, it is possible to calculate the warpage amount with high precision.

In the present exemplary embodiment, the position of the reference point serving as the reference of the rotation of the holding table 201 is previously determined and the position of the reference point when the holding table 201 holding the reference wafer or the wafer W thereon is rotated is specified. Then, based on the result, if the position of the reference point of the holding table in the first process and the position of the reference point of the holding table in the third process coincide with each other, the difference between the shape data is obtained. In this configuration, the positions of the reference point can be used to rapidly find out a condition where the rotational position of the holding table in the first process and the rotational position of the holding table in the third process coincide with each other, and, thus, the difference between the shape data can be obtained. Therefore, the warpage amount can be readily calculated with higher precision.

In the present exemplary embodiment, the reference wafer is the flat wafer. Further, the data on the profile line passing through the center of the end surface of the reference wafer are used as the shape data on the reference wafer, and the data on the profile line passing through the center of the end surface of the wafer W, which is the target substrate, are used as the shape data on the wafer W. In this case, the warpage amount of the wafer W can be more readily calculated using the data on the two profile lines.

Modification Example

Hereinafter, a modification example of the above-described exemplary embodiment will be described. In the above-described exemplary embodiment, it has been described that the profile line of the reference wafer and the profile line of the wafer whose warpage amount is to be calculated are calculated and then the correction is performed based on the information on the rotational position of the holding table before the warpage amount is calculated. However, the rotational position of the holding table may be previously determined when the image of the end surface of the wafer is taken. Thus, the correction based the information on the rotational position of the holding table may not be performed.

In the above-described exemplary embodiment, the rotational position of the holding table 201 is different between when the profile line of the reference wafer is obtained and when the profile line of the wafer whose warpage amount is to be calculated is obtained. Therefore, the correction based the information on the rotational position is performed. Meanwhile, the rotational position of the holding table 201 when the profile line of the reference wafer is obtained may coincide with the rotational position of the holding table 201 when the profile line of the wafer whose warpage amount is to be calculated is obtained. As a result, it is possible to calculate the difference between the data obtained at the same rotational position of the holding table 201 without performing the correction based the information on the rotational position. For this reason, the difference data do not include the component about the inclination depending on the rotational position of the holding table 201. Therefore, the warpage amount relative to the coordinates (angle) of the wafer W after the subtraction may not include the component caused by the inclination of the holding table 201 or may include the component whose amount is greatly reduced.

Figure 26:
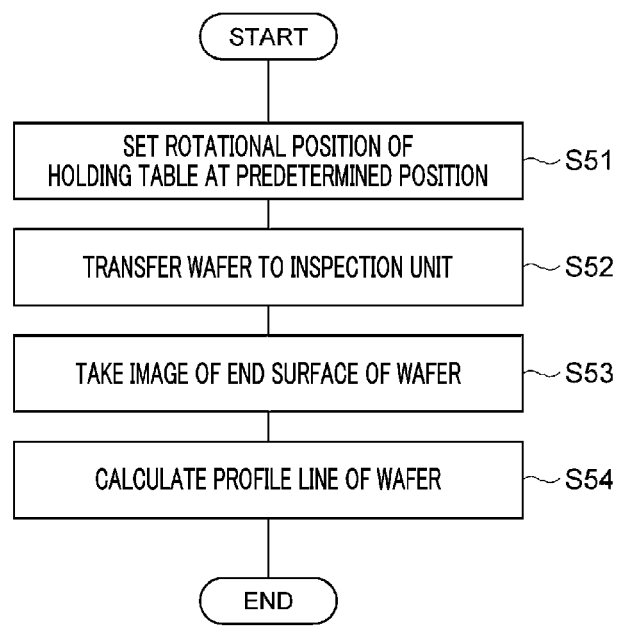
FIG. 26 is a flowchart provided to explain a modification example of the sequence of calculating the profile line of the wafer in the substrate processing method according to the exemplary embodiment.

The sequence of the processings is shown in FIG. 26. First, the controller 10 controls each of the components of the substrate processing system 1 to set the rotational position of the holding table 201 at a predetermined position (process S51). A method of setting at the predetermined position is not particularly limited and may include, e.g., a method of rotating the holding table 201 such that the reference point of the holding table 201 is at the predetermined position.

Then, the controller 10 controls each of the components of the substrate processing system 1 to transfer the wafer whose image is to be taken into the inspection unit U3 (process S52). Then, the controller 10 controls the rotary holder sub-unit 200 to maintain the wafer on the holding table 201. Then, the controller 10 controls the rotary holder sub-unit 200 to move the holding table 201 by the actuator 203 from the first position to the second position along the guide rail 204. Thus, the peripheral portion of the reference wafer is positioned between the illuminating module 420 and the mirror member 430.

Then, the controller 10 controls the rotary holder sub-unit 200 to rotate the holding table 201 by the actuator 202. Thus, the wafer held on the holding table 201 is rotated. In this state, the controller 10 controls the periphery imaging sub-unit 400 to turn on the light source 421 and take the image by the camera 410 (process S53). In this manner, the image of the end surface of the reference wafer is taken over the entire circumference of the periphery of the reference wafer.

Then, based on the image of the end surface of the reference wafer obtained in the process S53, the profile line of the wafer is calculated by the processor M3 (process S54). To be specific, the controller 10 makes the processor M3 determine the upper edge and the lower edge of the end surface of the reference wafer from the image based on, e.g., the contrast difference. Then, the controller 10 makes the processor M3 determine, as the profile line, the line passing through the middle positions between the upper edge and the lower edge. Thus, the shape of the end surface of the reference wafer is obtained.

The sequence shown in FIG. 26 can be used both when the profile line of the reference wafer is obtained and when the profile line of the wafer W whose warpage amount is to be calculated.

In the above-described modification example, the rotational position of the holding table 201 obtained immediately before holding the reference wafer and the rotational position of the holding table obtained immediately before holding the wafer W coincide with each other. For this reason, when the warpage amount is calculated from the difference between the profile lines, the condition where the rotational positions of the holding table 201 coincide with each other can be created even without performing the correction. Therefore, the warpage amount can be readily calculated with higher precision. Further, the control according to the modification example can be readily changed in design since software can be easily installed in the controller 10.

Other Exemplary Embodiments

As described above, the exemplary embodiment according to the present disclosure has been described in detail, but various modifications may be added to the above described embodiment within the scope of the gist of the present disclosure. For example, the reflection surface 432 has another shape (e.g., flat surface) other than the curved face, as long as the reflection surface 432 is inclined with respect to the rotation axis of the holding table 201 and is directed toward the end surface Wc and the peripheral portion Wd of the rear surface Wb of the wafer W held by the holding table 201.

The focus adjusting lens 427 may be omitted from the periphery imaging sub-unit 400. Any one of the light scattering member 422, the cylindrical lens 425, and the light diffusing member 426 may be omitted from the periphery imaging sub-unit 400.

The inspection unit U3 may be provided in the shelf units U10 and U11. For example, the inspection unit U3 may be provided in the cells of the shelf units U10 and U11, which are located correspondingly to the unit processing blocks 14 to 17. In this case, the wafer W is directly delivered to the inspection unit U3 by the arms A1 to A8 that transfer the wafer W.

When the warpage amount of the wafer W is calculated, the imaging module capable of imaging only the end surface Wc of the wafer W may be used, without using the periphery imaging sub-unit 400 capable of imaging both the end surface Wc of the wafer W and the peripheral portion Wd of the front surface Wa thereof. The front surface Wa of the wafer W, the rear surface Wb thereof, the end surface Wc thereof, and the peripheral portion Wd of the front surface Wa thereof may be imaged by different cameras. Images of at least two of the front surface Wa of the wafer W, the rear surface Wb thereof, the end surface Wc thereof, and the peripheral portion Wd of the front surface Wa thereof may be simultaneously taken by one camera.

Before and after the heat treatment of the process S24, the wafer inspection processing may be performed in the same inspection unit U3, or the wafer inspection processing may be performed in the different inspection units U3.

The inspection processing of the wafer W in the process S25 may be performed, not after the periphery exposure processing in the process S24, but after the heat treatment in the heat treatment unit U2 in the process S22 (so-called "PAB") and before the exposure processing in the process S26.

The timing of the wafer inspection processing (re-inspection processing) by the inspection unit U3 may be changed appropriately. For example, the wafer inspection processing (re-inspection processing) (process S28) may be performed by the inspection unit U3 between the heat treatment in the process S24 and the periphery exposure processing in the process S25. In this case, the periphery exposure processing in the process S25 may determine the exposure width based on the warpage amount calculated by the wafer inspection processing in the process S28.

Subsequent processes S24 to S27 may be performed without performing the edge rinsing processing of the process S23. Although not shown, the subsequent processes S26 and S27 may be performed after performing the heat treatment of the process S24 without performing the periphery exposure processing of the process S25.

The warpage amount calculated by the wafer inspection processing (S21) in the inspection unit U3 may be used in the subsequent heat treatment (process S24) in the heat treatment unit U2. For example, the determination on whether the wafer W is to be sucked to the heating plate of the heat treatment unit U2, and the controlling of the suction amount, the suction position, the suction pressure, the suction timing, and the like may be performed based on the warpage amount.

According to the exemplary embodiments, there is provided a technology capable of measuring the bending of the wafer with high precision.

From the foregoing, it will be appreciated that various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate inspection method, comprising:
   (1-1) taking, while rotating a holding table on which a reference substrate whose warpage amount is already known is held, an image of an end surface of the reference substrate over an entire circumference of a periphery of the reference substrate by a camera;
   (1-2) obtaining shape data on the end surface of the reference substrate over the entire circumference of the periphery of the reference substrate by processing the image obtained in the taking of the image of the end surface of the reference substrate;
   (1-3) obtaining information on a rotational position of the holding table with respect to the shape data of the reference substrate;
   (2-1) taking, while rotating the holding table on which a target substrate is held, an image of an end surface of the target substrate over an entire circumference of a periphery of the target substrate by the camera;
   (2-2) obtaining shape data on the end surface of the target substrate over the entire circumference of the periphery of the target substrate by processing the image obtained in the taking of the image of the end surface of the target substrate;
   (2-3) obtaining information on a rotational position of the holding table with respect to the shape data of the target substrate;
   (2-4) correcting the shape data of the target substrate such that the rotational position of the holding table with respect to the shape data of the reference substrate coincides with the rotational position of the holding table with respect to the shape data of the target substrate; and
   (2-5) calculating a warpage amount of the target substrate by obtaining a difference between the shape data obtained in (1-2) and the shape data corrected in (2-4).

2. The substrate inspection method of claim 1,
   wherein the holding table has a reference point serving as a reference of rotation of the holding table,
   in (1-1), information specifying a position of the reference point when the holding table is rotated is obtained, in (2-1), information specifying a position of the reference point when the holding table is rotated is obtained, and in (2-5), the information specifying the position of the reference point when the holding table is rotated in (1-1) is related to the shape data obtained in (1-2); the information specifying the position of the reference point when the holding table is rotated in (2-1) is related to the shape data obtained in (2-2); and the difference between the shape data obtained in (1-2) and the shape data obtained in (2-2) is obtained under a condition that the position of the reference point of the holding table in (1-1) coincides with the position of the reference point of the holding table in (2-1).

3. The substrate inspection method of claim 1, wherein a rotational position of the holding table obtained immediately before the reference substrate is held in (1-1) is allowed to coincide with a rotational position of the holding table obtained immediately before the target substrate is held in (2-1), and in (2-5), the difference between the shape data obtained in (1-2) and the shape data obtained in (2-2) is obtained.

4. The substrate inspection method of claim 1, wherein the reference substrate is flat, the shape data obtained in (1-2) are data on a first profile line passing through a center of the end surface of the reference substrate, and the shape data obtained in (2-2) are data on a second profile line passing through a center of the end surface of the target substrate.

5. A substrate inspection apparatus, comprising:

a holding table configured to hold and rotate a target substrate; and a controller configured to control a camera, wherein the controller performs:

(1-1) taking, while rotating the holding table on which a reference substrate whose warpage amount is already known is held, an image of an end surface of the reference substrate over an entire circumference of a periphery of the reference substrate by the camera;

(1-2) obtaining shape data on the end surface of the reference substrate over the entire circumference of the periphery of the reference substrate by processing the image obtained in the taking of the image of the end surface of the reference substrate;

(1-3) obtaining information on a rotational position of the holding table with respect to the shape data of the reference substrate;

(2-1) taking, while rotating the holding table on which the target substrate is held, an image of an end surface of the target substrate over an entire circumference of a periphery of the target substrate by the camera;

(2-2) obtaining shape data on the end surface of the target substrate over the entire circumference of the periphery of the target substrate by processing the image obtained in the taking of the image of the end surface of the target substrate;

(2-3) obtaining information on a rotational position of the holding table with respect to the shape data of the target substrate;

(2-4) correcting the shape data of the target substrate such that the rotational position of the holding table with respect to the shape data of the reference substrate coincides with the rotational position of the holding table with respect to the shape data of the target substrate; and (2-5) calculating a warpage amount of the target substrate by obtaining a difference between the shape data obtained in (1-2) and the shape data corrected in (2-4).

6. A non-transitory computer-readable recording medium having stored thereon computer-executable instructions that, in response to execution, cause a substrate inspection apparatus to perform a substrate inspection method as claimed in claim 1.

7. The substrate inspection method of claim 1, wherein a component for specifying a position of a reference point of the holding table is provided on the holding table, and in (1-3), the rotational position of the holding table is obtained based on the reference point of the holding table.

8. The substrate inspection apparatus of claim 5, wherein a component for specifying a position of a reference point of the holding table is provided on the holding table, and in (1-3), the rotational position of the holding table is obtained based on the reference point of the holding table.

* * * * *